United States Patent
Suguro et al.

(10) Patent No.: US 6,614,033 B2
(45) Date of Patent: *Sep. 2, 2003

(54) ION IMPLANTATION APPARATUS, ION GENERATING APPARATUS AND SEMICONDUCTOR MANUFACTURING METHOD WITH ION IMPLANTATION PROCESSES

(75) Inventors: Kyoichi Suguro, Yokohama (JP); Atsushi Murakoshi, Kawasaki (JP); Katsuya Okumura, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 10/002,296

(22) Filed: Dec. 5, 2001

(65) Prior Publication Data

US 2002/0050573 A1 May 2, 2002

Related U.S. Application Data

(63) Continuation of application No. 09/291,967, filed on Apr. 15, 1999, now Pat. No. 6,335,534.

(30) Foreign Application Priority Data

Apr. 17, 1998 (JP) .............................. 10-107693
Mar. 19, 1999 (JP) ............................. 11-074851

(51) Int. Cl.⁷ .......................... H01J 37/317; G03F 9/00

(52) U.S. Cl. ................. 250/491.1; 250/492.2; 250/492.21; 250/398

(58) Field of Search ......................... 250/491.1, 492.2, 250/492.21, 398

(56) References Cited

U.S. PATENT DOCUMENTS

| 4,158,141 A | * | 6/1979 | Seliger et al. ........... 250/492 A |
| 4,448,865 A | | 5/1984 | Bohlen et al. .................. 430/5 |
| 4,823,011 A | * | 4/1989 | Stengl et al. ............. 250/491.1 |
| 4,835,392 A | * | 5/1989 | Loschner et al. ......... 250/492.2 |
| 4,967,088 A | * | 10/1990 | Stengl et al. ............. 250/491.1 |
| 5,962,858 A | | 10/1999 | Gwinn ................... 250/192.21 |
| 6,020,592 A | | 2/2000 | Liebert et al. ......... 250/192.21 |
| 6,335,534 B1 | * | 1/2002 | Suguro et al. ......... 250/492.21 |

FOREIGN PATENT DOCUMENTS

| JP | 54-14680 | 2/1979 |
| JP | 10-188833 | 7/1998 |

* cited by examiner

*Primary Examiner*—Nikita Wells
(74) *Attorney, Agent, or Firm*—Finnegan, Henderson, Farabow, Garrett & Dunner, L.L.P.

(57) ABSTRACT

An electrically conductive mask having openings formed is located above a semiconductor substrate and ions are implanted into the surface of the semiconductor substrate through the electrically conductive mask, thereby forming ion implanted layers. For ion implantation under different conditions, a dedicated electrically conductive mask is used with each ion implantation step.

28 Claims, 15 Drawing Sheets

ION IMPLANTATION APPARATUS, ION GENERATING APPARATUS AND SEMICONDUCTOR MANUFACTURING METHOD WITH ION IMPLANTATION PROCESSES

This is a continuation of application Ser. No. 09/291,967, filed Apr. 15, 1999 now U.S. Pat. No. 6,335,584 which is incorporated herein by reference.

BACKGROUND OF THE INVENTION

Recently, most computers and communications apparatus use large-scale integration (LSI) circuits each having large numbers of transistors and resistors integrated into a single chip with interconnections. Thus, the performance of the entire apparatus depends greatly on the performance of the LSI chip. The performance of the LSI chip can be upgraded by increasing the packing density, that is, scaling down the dimensions of on-chip devices.

Scaling down the dimensions of devices can be achieved by optimizing the ion implantation and subsequent thermal annealing in forming diffusions such as source/drain diffusions. This allows MOS devices with shallow source/drain diffusions of 0.2 $\mu$m or less in depth to be realized.

In order to form such shallow diffusions, it is required to make a low thermal budget so that impurity atoms are distributed shallow upon ion implanting and are not diffused deep in the subsequent thermal process.

On the other hand, in order to form through impurity doping a well in which a device, such as a MOS transistor, is formed and a region (a channel doped layer) in which the channel of the MOS transistor is induced, it is required to control precisely the implant dose.

The production of MOS transistors having channels of opposite conductivity type or MOS transistors having different threshold voltages in the same substrate inevitably requires the use of a resist mask in each of ion implantation processes for wells, channels, or polysilicon gate electrodes.

That is, it is required to coat a layer of resist onto the entire surface, remove portions of the resist that are located above regions where ion implantation should take place to thereby define a resist pattern, and ion-implant impurities into the regions using this resist pattern as a mask.

This approach involves a sequence of steps of resist coating, exposure to light, resist development (resist pattern formation), ion implantation, resist ashing, and wet cleaning using $H_2SO_4$—$H_2O_2$ mixture.

The ion implantation (ion irradiation) has been extensively used as a method of forming pn junctions by introducing impurities, such as boron (B), phosphorus (P), arsenic (As), etc., into a semiconductor substrate. This ion implantation method allows impurities to be introduced into target sites with their concentration and depth controlled precisely.

The ion source chambers at the heart of ion implantation apparatus are roughly classified into three: the Burnus type, the Freeman type, and the microwave type that uses a magnetron.

FIGS. 16A and 16B show, in sectional view, the conventional Burnus type ion source chamber. More specifically, FIG. 16A is a sectional view taken parallel to the top of the ion source chamber, and FIG. 16B is a sectional view taken parallel to the side of the chamber. On one side of an arc chamber 71 is mounted a tungsten filament 77 by insulating supports 75 and reflectors (spacers). On the opposite side is mounted an electrode 74 by an insulating support 75 so as to be opposed to the filament 77.

Next, description is given of a method of extracting ions using this apparatus. A gas, such as an Ar gas, is introduced into the arc chamber through a gas inlet 72 and thermal electrons are released from the tungsten filament 77. The direction of movement of the thermal electrons is changed to the reverse direction to the direction of emission from the filament by the opposed electrode 74, thereby increasing the probability of collision of the thermal electrons with the Ar gas introduced into the arc chamber to ionize the Ar gas. The resulting ions are taken out of the chamber through an ion outlet 23 provided in a front plate 78.

FIGS. 17A and 17B show, in sectional view, the conventional Freeman type ion source chamber. More specifically, FIG. 17A is a sectional view taken parallel to the top of the chamber, and FIG. 17B is a sectional view taken parallel to the side of the chamber. On the opposed sides of an arc chamber 91 are mounted reflectors 96 by insulating supports 95. A bar-like tungsten filament 99 is attached to the opposed reflectors 96.

Next, description is given of a method of taking out ions using this apparatus. A gas, such as an Ar gas, is introduced into the arc chamber through a gas inlet 92 and thermal electrons are released from the tungsten filament 97. At the same time, a magnetic field parallel to the filament 97 is produced by electromagnets 100 and a rotating magnetic field is produced by a current in the filament electrode. Within the arc chamber 91 the movement of electrons is disturbed by the action of the reflectors 96, thereby increasing the probability of collision of thermal electrons emitted by the tungsten filament 97 with the Ar gas introduced into the arc chamber. The resulting ions are taken out of the chamber through an ion outlet 93 provided in a front plate 98.

FIG. 18 shows, in sectional view, of the microwave type ion source chamber. To take out ions using this apparatus, microwaves are generated by a magnetron 111 and then introduced into a discharge box 113 through a waveguide 112, thereby generating a plasma in the discharge box, which corresponds to the above-described arc chamber. The resulting ions are taken out through an electrode 114.

In these conventional ion source chambers, ions to be implanted are generally obtained by introducing a gas or vapor produced by sublimating a solid into the arc chamber and ionizing the gas or vapor by the aforementioned plasma. That is, in the conventional ion source chambers, ions are required to be supplied in the form of vapor or gas. However, with a refractory metal such as boron or titan, in order to obtain a vapor pressure of the order of 1E-4TORR necessary for ion implantation, it is required to heat the metal to a very high temperature (for example, 1400° C. or above for titan). In practice, ion implantation is impossible with this method.

Conversely, indium, having a melting point as low as 156° C., melts easily in plasma and hence is very inconvenient to use.

On the other hand, an ion implantation method has been developed which uses gases of chlorides or fluorides of those metals, enabling those low melting point metals to be used. However, this method inevitably causes corrosion of the inner walls of the arc chamber and the thermal electrons emitting filament due to chlorine, fluorine, chloride compounds, or fluoride compounds resulting from chloride gases or fluoride gases.

For indium as well, an attempt was made to use its chloride gas. For example, when vapor obtained by heating InCl₃ to 330° C. is introduced into the conventional ion source chamber shown in FIGS. 16A and 16B for the purpose of ion implantation, chlorine ions or radicals dissociated from InCl₃ etch not only the inner walls of the arc chamber that is made mainly of tungsten but even the tungsten filament. As a result, the filament becomes thinned considerably, resulting in an increase in resistance and failure to perform necessary control for arc discharge. In addition, even the outlet electrode is etched, disabling ions from being taken out stably. As a result, a large number of abnormal discharges comes to occur in about five hours, disabling ion implantation.

Thus, so long as chlorine-based compounds are used to ionize the refractory metals and indium, etching reaction due to chlorine ions or chlorine radicals resulting from the ionization inevitably occurs in the inner walls of the arc chamber and the tungsten filament.

Moreover, when a chloride gas, such as indium chlorine, and a fluoride gas, such as boron fluoride or germanium fluoride, are alternately introduced into the same arc chamber and then ionized, fluorine is attracted to the walls at the time when the boron fluoride is introduced and then reacts with chlorine at the time when the chloride gas is introduced to form chlorine fluoride that is a strong oxidizing agent. This accelerates the corrosion of the inner walls of the arch chamber and the thermal electron emitting filament although they are made of aluminum, stainless or stable refractory metals such as tungsten, molybdenum, and graphite. Furthermore, it becomes necessary to remove bad effect of fluorine and chlorine in exhaust gas, increasing the apparatus cost.

In the case of an oxide gas, on the other hand, carbon (graphite)-based members used in an ion generator or ion irradiation apparatus, particularly electrodes for taking out ions, are oxidized, which significantly reduces the life of the apparatus.

In particular, the filament suffers corrosion due to chlorine and fluorine, thus making it difficult to obtain stable arc discharge over a long period of time. With noble metals, such as gold and platinum, that are difficult to obtain their chlorides, ion implantation is still very difficult.

Further, a solid fluoride has deliquescence and, while being loaded into a heating oven, reacts with moisture in atmosphere to dissolve. It is thus very inconvenient to use.

To solve the problems described so far, the inventors of this invention disclosed in Japanese Unexamined Patent Publication No. 10-188833 a method which, as illustrated in FIGS. 19A to 19C as an improved version of the Burnus type ion source chamber, places a plate-like material 79 consisting of a desired ion source within the arc chamber 71, generates a plasma in the arc chamber, and subjects the material to sputtering to generate desired ions (hereinafter referred to as sputtered ions). This method is excellent in that, unlike the previously described methods, ions of refractory metals can be generated with ease. In FIGS. 19A to 19C, like reference numerals are used to denote corresponding parts to those in FIGS. 16A and 16B.

Even with this method using sputtered ions, however, it is still very difficult to implant stably ions of a metal, such as indium, which is low in melting point and a metal, such as antimony, whose solid is unstable.

In ion implanting p-type impurities and n-type impurities using conventional semiconductor substrate manufacturing methods, it is a common practice to use separate ion or exchange source gases or solid sources serving as ion sources. In the former case, two or more ion implantation apparatuses are needed for processing of the same semiconductor substrate. In the latter case, a time is required to confirm conditions for stable ion implantation after an exchange is made. Either of these cases becomes a problem in reducing the semiconductor device manufacturing cost.

BRIEF SUMMARY OF THE INVENTION

Ion implantation apparatus of the present invention comprises an electrically conductive mask having an opening and located apart from an object to be processed; and an ion implanting section which implants ions into the object through the opening of the electrically conductive mask.

Here, the conductivity of the conductive mask means not only conductivity such as metals have but conductivity in the range between metals and insulators such as semiconductors have.

With such ion implantation apparatus, desired regions of an object to be processed can be selectively implanted with ions through the conductive mask having openings formed. Thus, for different ion implantation processes, a separate conductive mask can be used for each of the ion implantation process, eliminating the need of using any resist pattern.

Therefore, the prior need of a sequence of processes of resist coating, exposure to light, resist development, ion implantation, resist ashing, and wet cleaning using $H_2SO_4$—$H_2O_2$ mixture can be eliminated, simplifying the ion implantation processes. As a result, the time and cost required to manufacture LSI devices can be reduced. Furthermore, heat treatment can be performed to reduce lattice defects in each ion-implanted layer in number, without the necessity of conducting a ashing process to remove the resist. The ion implanted layers can therefore have a lower defect density. This helps to greatly enhance the performance and reliability of the LSI element.

An ion generator of the present invention comprises a container formed in a shape of a box; a holding section which holds a solid material that includes a plurality of elements on an inner wall of the container; a plasma generating section which generates a plasma in the container to thereby sputtering the solid material held by the holding section in the container for generating ions of the plurality of elements; a gas introducing section which introduces into the container a plasma-generating gas for generating a plasma used for sputtering the solid material; a liquid trapping section which traps a liquid resulting from the sputtering; and a taking out section which takes plural species of ions generated by sputtering the solid material out of the container.

An ion implantation apparatus of the present invention comprises a container formed in a shape of a box; a holding section which holds a solid material that includes a plurality of elements on the inner wall of the container; a plasma generating section which generates a plasma in the container to thereby sputtering the solid material held by the holding section for generating ions of the plurality of elements; a gas introducing section which introduces into the container a gas for generating a plasma used for sputtering the solid material; a liquid trapping section which traps a liquid resulting from the sputtering; a taking out section which takes a plural species of ions generated by sputtering the solid material out of the container; and a directing section which directs a selected desired species ion of the plural species of ions taken out of the container by the taking out section onto an object to be processed.

Such an ion generator or ion implantation apparatus allows liquid of an ion generating element resulting from sputtering to be trapped in the liquid trap. Thereby, the liquid can be prevented from being exposed to the plasma. Thus, as ion generating elements, low-melting point elements or unstable elements can be used without the occurrence of abnormal discharges. Stable ion implantation can be performed.

Still another ion implantation apparatus of the present invention comprises a container formed in a shape of a box; a holding section which holds a solid material that includes a plurality of elements on a inner wall of the container; a plasma generating section which generates a plasma in the container to thereby sputtering the solid material held by the holding section for generating ions of the plurality of elements; a gas introducing section which introduces into the container a gas for generating a plasma used for sputtering the solid material; a liquid trapping section which traps a liquid resulting from the sputtering; a taking out section which takes a plural species of ions generated by sputtering the solid material out of the container; a directing section which directs a selected desired species ion of the plural species of ions taken out of the container by the taking out section onto an object to be processed; and an electrically conductive mask located apart from the object to be processed and having openings formed to allow the selected desired species ion of the plural species of ions to pass through.

Such an ion implantation apparatus can provides the advantages of the two ion implantation apparatuses described above.

A semiconductor device manufacturing method of the present invention comprises the steps of introducing a gas into a container in which a solid material including a plurality of elements is held; converting the gas into a plasma in the container, irradiating the solid material with the plasma to thereby sputtering the solid material and generating ions of the plurality of elements; trapping a plurality of elements in liquid form generated on the surface of the solid material during the step of generating the ions of the plurality of elements in a liquid trap; taking the plural species of ions generated by the sputtering the solid material out of the container; directing the plural species of ions taken out of the container toward an objected to be processed; and irradiating a desired object to be processed with the directed plural species of ions.

Another semiconductor device manufacturing method of the present invention comprises the steps of introducing an inert gas and a nitrogen gas into a container in which a material including a plurality of elements is held; converting the inert gas and the nitrogen gas into plasmas in the container, irradiating the solid material with the plasmas of the inert gas and the nitrogen gas to thereby sputtering the solid material and generating ions of the plurality of elements; nitriding a liquid including an element of the plurality of elements generated on the surface of the solid material during the step of generating the plurality of ions with the nitrogen gas; taking the plural species of ions generated by the sputtering the solid material out of the container; directing the plural species of ions taken out of the container toward an objected to be processed; and irradiating a desired object to be processed with the directed plural species of ions.

According to such semiconductor manufacturing methods, two or more ion species can be generated by sputtering the material. That is, ions required can be generated without exchanging ion sources. Thereby, p-type impurities and n-type impurities can be implanted successively without exchanging ion sources. Thus, the cost required to manufacture semiconductor devices can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

The manufacture of an LSI device, such as a DRAM, requires about 20 to 30 lithographic processes. About 30 percent of the lithographic processes are carried out for ion implantation. Each ion implantation process needs such a sequence of processes as described previously. For this reason, the time and cost required to manufacture LSI devices increase. In view of such problems with the prior art techniques, this invention was made.

Figure 1:
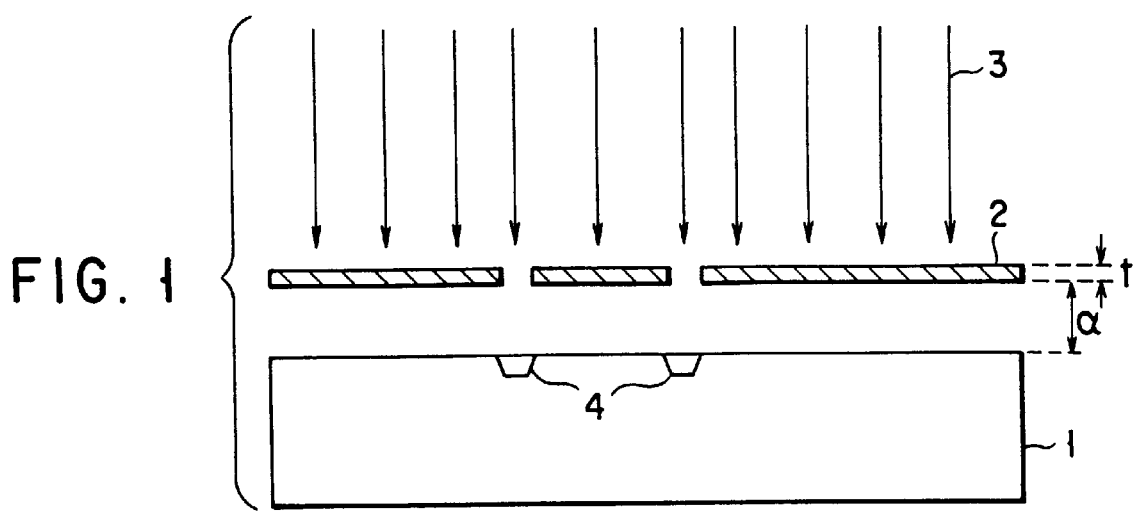
FIG. 1 is a schematic representation, in sectional view, of an ion-implanted layer formation method according to a first embodiment of the present invention.

FIG. 1 illustrates, in sectional view, an ion-implanted layer formation method in accordance with a first embodiment of the present invention.

In this figure, 1 denotes a semiconductor substrate (an object to be processed) placed in a sample chamber of an ion implantation apparatus. A conductive mask 2 with two openings is located above the semiconductor substrate 1. The ion implantation apparatus used in this embodiment differs from conventional ones in that the conductive mask 2 is provided. Thus, the mechanism of implanting ions into the semiconductor substrate 1 through the conductive mask 2 remains unchanged from the conventional one, and description thereof is therefore omitted. The construction of the entire ion implantation apparatus will be described later, Although the distance d between the semiconductor substrate 1 and the conductive mask 2 is generally set to be in the range of 1 $\mu$m to 100 mm, it is desirable to set the distance d to a value to be described later.

In order to prevent the conductive mask 2 from warping, it is desirable that the thickness t of the mask be set to 1 $\mu$m or more. To avoid the contamination of the semiconductor substrate 1, the conductive mask 2 should preferably be made of the same element as the semiconductor substrate or a material that consists mainly of the same element.

When the semiconductor substrate 1 is made of silicon, ions 3, such as $P^+$, $B^+$, $BF_2^+$, $As^+$, $Sb^+$ $In^+$, or $Ga^+$, are implanted into the surface of the substrate through the conductive mask 2. The ions 3 are in the form of a beam. This beam of ions is generated by introducing a gas of, for example, $BF_3$ into an ion source chamber, generating ions, such as $F_2^+$, by means of plasma discharge, and accelerating the resulting ions within an acceleration tube.

By implanting the ions 3 into the substrate surface in that manner, ion-implanted layers 4 are formed into portions of the substrate surface which are located below the openings of the conductive mask 2. At this point, the conductive mask can be prevented from charging up owing to its conductivity.

When the temperature of the conductive mask is raised to 50° C. or above as a result of being irradiated with ions, the conductive mask of, say, 10 mm in width will expand by 1.5 $\mu$m. It is therefore desirable to suppress the temperature raise of the mask to 5° C. or below.

In order to control the accuracy of alignment between the substrate regions where the ion-implanted layers are formed and the openings of the conductive mask to 0.15 $\mu$m or less, it is required to cool the conductive mask with a cooling medium and thereby minimize the expansion.

For the accurate alignment of the conductive mask 2 relative to the semiconductor substrate 1, it is recommended to use an optical method in which alignment marks are formed beforehand on the semiconductor substrate and detected using an infrared laser.

The distance d between the semiconductor substrate and the conductive mask should be set to 15 $\mu$m or less and preferably 3 $\mu$m or less. Setting the distance d to 3 $\mu$m or less allows electric charges from the semiconductor substrate to escape to the conductive mask very easily, preventing the semiconductor substrate from charging up.

After the formation of the ion-implanted layers, the ions 3 in the ion-implanted layers can be activated through annealing to form impurity doped layers.

According to this embodiment, ion layers can be formed in selected regions of the semiconductor substrate 1 by implanting ions into the surface thereof through the conductive mask 2 having openings.

As a result, by using a separate conductive mask for each of the ion implantation processes involved, required ion-implanted layers can be formed without using any resist patterns.

Therefore, this embodiment eliminates the prior need of a sequence of steps of resist coating, exposure to light, resist development, ion implantation, resist ashing, and wet cleaning using $H_2SO_4$—$H_2O_2$ mixture for each of the ion implantation processes, simplifying the ion implantation processes.

As a result, the time and cost required to manufacture LSI devices can be reduced.

To be specific, the lithographic processes can be reduced by 30%. For example, with DRAMs, the number of lithographic processes can be reduced from 30 to 21. Thus, the time from when the manufacture of an LSI device is initiated until it is completed (TAT: Turn Around Time) can be reduced by more than 30% and a significant reduction in cost can be achieved.

The use of no resist patterns eliminates the need of ashing of resist patterns having metal mixed in, thus reducing metal contamination.

The annealing step for activating ions in the ion-implanted layers 4 may be performed subsequent to the formation of these ion-implanted layers. If other ion-implanted layers are present, then the annealing step may be performed in common on ion-implanted layers which have been formed in separate processes.

Second Embodiment

Figure 2:
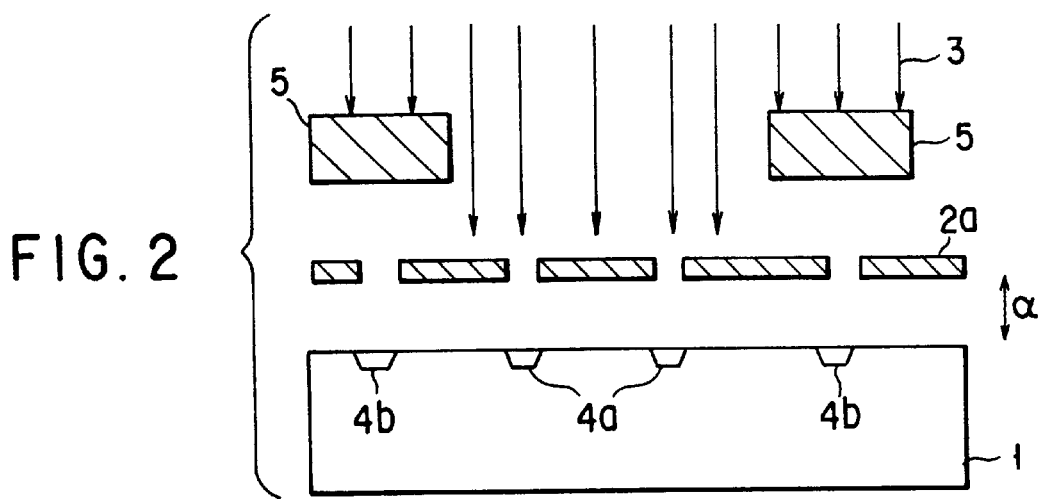
FIG. 2 is a schematic representation, in sectional view, of an ion-implanted layer formation method according to a second embodiment of the present invention.

FIG. 2 shows, in sectional view, an ion-implanted layer formation method according to a second embodiment of the present invention. Like reference numerals are used to denote corresponding parts to those in FIG. 1 and detailed description thereof is omitted (this is the case with other embodiments).

In this embodiment, a conductive mask 2a is located above the semiconductor substrate 1 with a spacing of 10 to 30 μm therebetween. A shutter 5, made of a conductive material, are placed above the conductive mask 2a. The dimension of the conductive mask 2a in the left-to-right direction of FIG. 2 is relatively large, of the order of 1 mm or more. An ion implantation apparatus used in this embodiment differs from conventional ones in that the conductive mask 2a and the shutters 5 are provided.

To prevent contamination of the semiconductor substrate 1, as with the conductive mask 2a, the shutters 5 should preferably be formed of the same element as the semiconductor substrate or a material that consists mainly of the same element.

In this embodiment, as shown in FIG. 2, ion implantation is performed to form ion-implanted layers 4a in substrate regions where n-type diffused layers are to be formed with the two outer openings of the mask 2a covered from the ion beam by the shutters 5. After that, with the two inner openings of the mask covered from the ion beam by the shutters, ion implantation is performed to form ion-implanted layers 4b into substrate regions where p-type diffused layers are to be formed.

The second embodiment also provides the same advantages as the first embodiment. Moreover since a single conductive mask is used to form the ion-implanted layers 4a and 4b of opposite conductivity type, there exists no alignment error, the positioning of the layers 4a and 4b with respect to each other is accurate. The number of openings of the mask 2a, while being set to four in this embodiment, may be set to three or less or to five or more.

Third Embodiment

Figure 3:
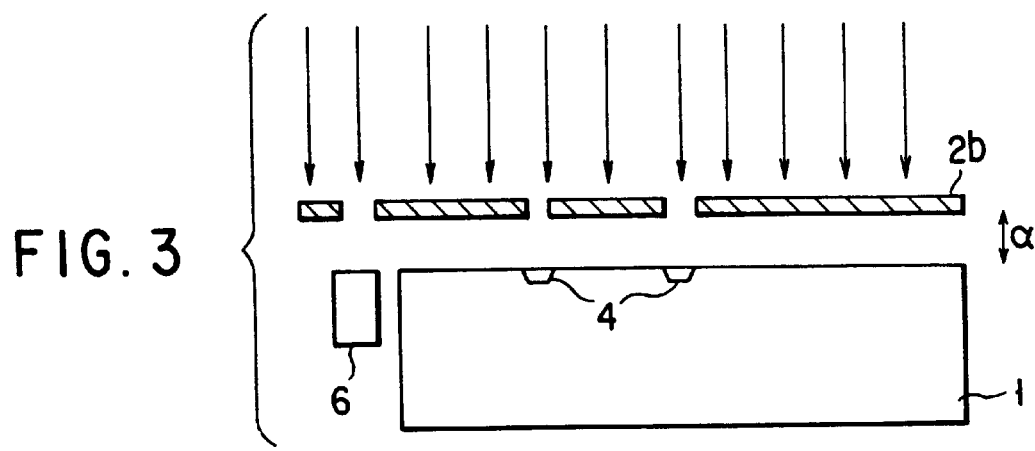
FIG. 3 is a schematic representation, in sectional view, of an ion-implanted layer formation method according to a third embodiment of the present invention.

FIG. 3 shows, in sectional view, an ion-implanted layer formation method according to a third embodiment of the present invention.

This embodiment differs from the first embodiment in that a conductive mask 2b is used which has an opening formed in its portion outside the semiconductor substrate 1 and an ion beam detector, such as a Faraday cup, is provided for detecting a beam of ions passing through that opening.

It is desirable to provide the opening in a site irradiated with an ion beam under the same conditions as the semiconductor substrate. The distance d is of the order of 2 to 3 μm.

The third embodiment also provides the same advantages as the first embodiment. In addition, this embodiment can detect an ion beam, with which the semiconductor substrate is irradiated, through the ion beam detector 6 and utilize the result of detection (ion beam current) as a monitor signal. Thus, by feeding back this monitor signal, the amount of ions implanted into the semiconductor substrate can be controlled.

Fourth Embodiment

Figure 4:
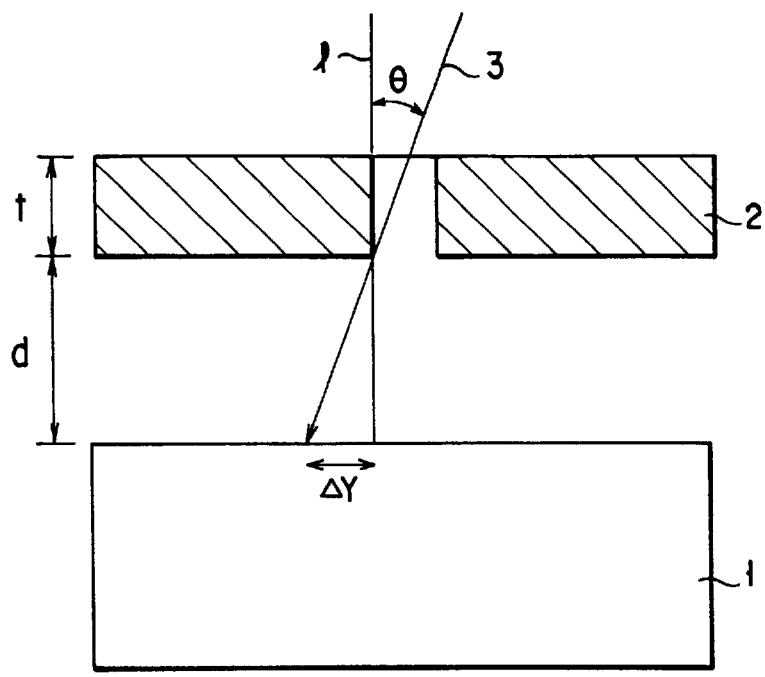
FIG. 4 is a schematic representation, in sectional view, of an ion-implanted layer formation method according to a fourth embodiment of the present invention.

FIG. 4 shows, in sectional view, an ion-implanted layer formation method according to a fourth embodiment of the present invention.

This embodiment differs from the first embodiment in that the semiconductor substrate 1 is irradiated with ions 3 at an angle of θ with respect to the normal 1 to the substrate surface.

The fourth embodiment also provides the same advantages as the first embodiment. In addition, this embodiment can form shallow ion-implanted layers in the surface of the semiconductor substrate even with a high acceleration voltage.

Figure 5:
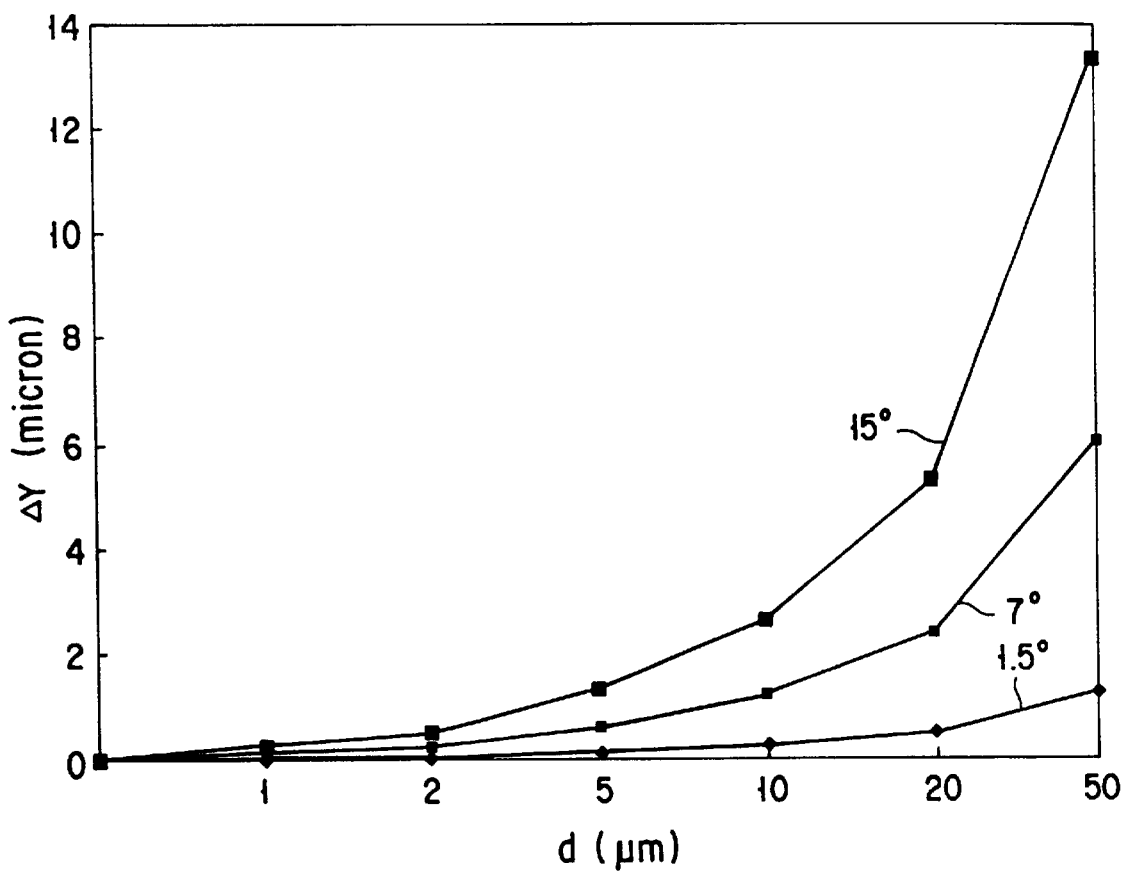
FIG. 5 shows a relationship among the angle $\theta$ of incidence of ions, the distance d, and the lateral displacement $\Delta Y$ of the ions shown in FIG. 4.

FIG. 5 plots the ion offset distance ΔY against the distance d between the conductive mask and the semiconductor substrate with the incident angle θ of ion beam 3 taken as a parameter. The ion offset distance ΔY is defined, as shown in FIG. 4, as the distance between the point on the semiconductor substrate at which the ion beam 3 passing through the opening of the mask 2 at the angle θ hits and the normal to the substrate surface that passes through the edge of that opening.

From FIG. 5 it can be seen that, when the distance d is about 2 μm and the ion beam 3 is directed onto the semiconductor substrate at an angle θ of seven degrees, the distance ΔY is less than 0.25 μm. Thus, when the distance d is set to 5 μm or more in situations where there is no concern about charging up of the semiconductor substrate, it is required to set the incident angle θ to five degrees or less.

Fifth Embodiment

Figure 6A:
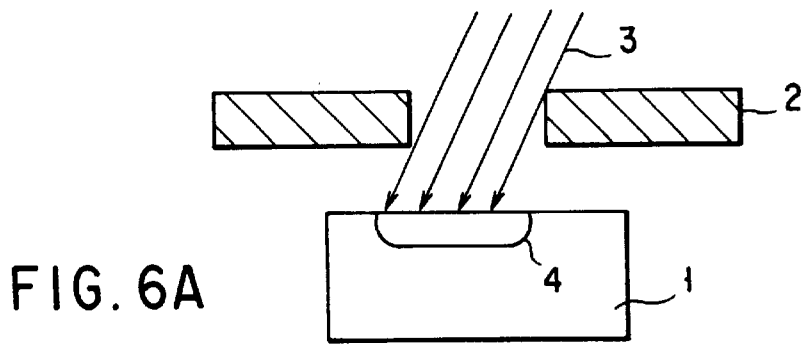
FIGS. 6A, 6B and 6C are schematic illustrations, in the order of steps, of an ion-implanted layer formation method according to a fifth embodiment of the present invention.
Figure 6B:
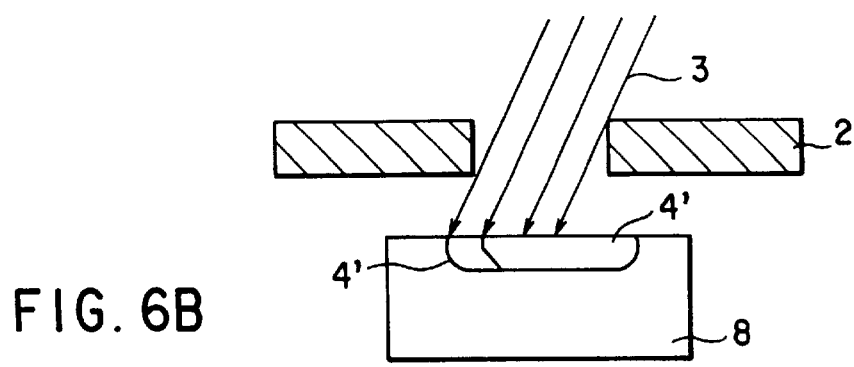
Figure 6C:
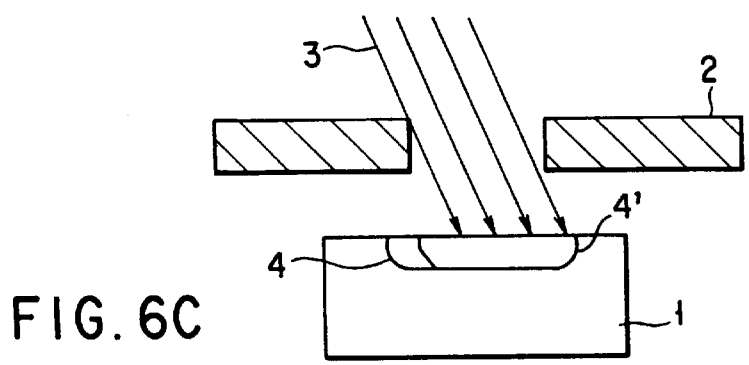

FIGS. 6A, 6B and 6C show, in sectional view, an ion-implanted layer formation method according to a fifth embodiment of the present invention.

With angled ion implantation as in the fourth embodiment, a non-implanted region is produced in a portion of the semiconductor substrate on the side of an edge of the opening of the conductive mask 2 as shown in FIG. 6A. That is, the ion-implanted layer 4 is formed in a different pattern from the opening of the mask.

When the non-implanted region becomes a problem, the angled ion implantation is simply performed again to form an ion-implanted layer 4' as shown in FIG. 6B with the semiconductor substrate 1 rotated through 180 degrees. Instead of rotating the semiconductor substrate, the direction of transmission of the ion beam 3 onto the semiconductor substrate may be changed as shown in FIG. 6C.

Figures 7A, 7B:
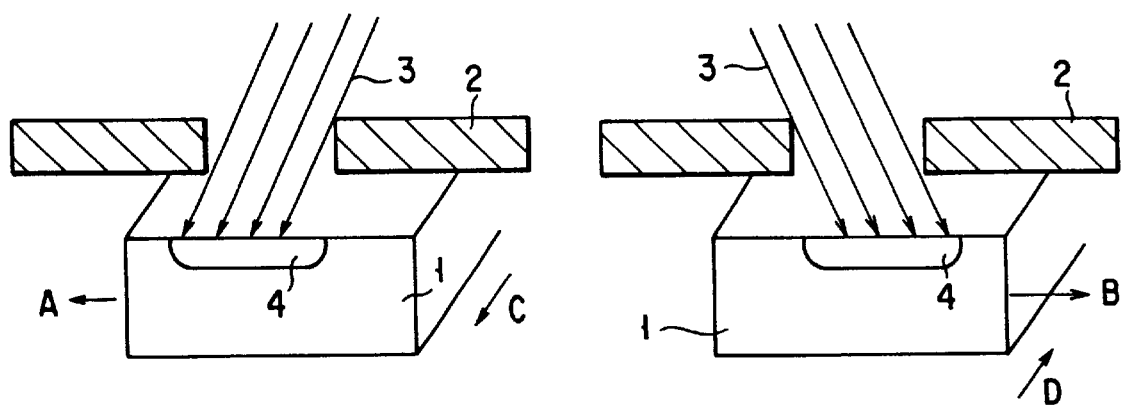
FIGS. 7A and 7B shows a modification of the fifth embodiment.

A more desirable method is illustrated in FIGS. 7A and 7B. That is, the semiconductor substrate 1 is moved relative to the ion beam 3 in one direction A and back in the opposite direction B at a speed of 50 to 100 cm/sec. The direction of transmission of the ion beam onto the semiconductor substrate is changed when the direction of movement of the semiconductor substrate is reversed. This approach allows non-implanted region-free angled ion implantation to be completed in a shorter period of time. The semiconductor substrate may be moved alternately in directions C and D perpendicular to directions A and B.

Sixth Embodiment

Figure 8A:
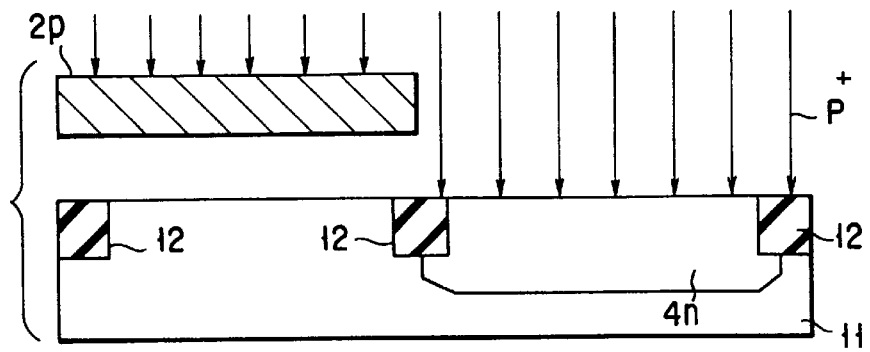
FIGS. 8A and 8B are schematic illustrations, in the order of steps, of a method of forming p- and n-wells in CMOS processing in accordance with a sixth embodiment of the present invention.
Figure 8B:
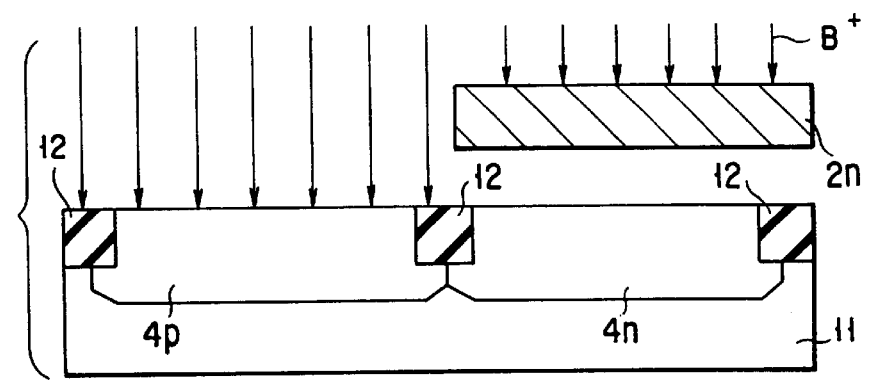

FIGS. 8A and 8B show, in sectional view, a method of forming p- and n-wells for CMOS devices in accordance with a sixth embodiment of the present invention.

First, as shown in FIG. 8A, a device isolation insulating film 12 is formed over the surface of a silicon substrate 11.

Next, as shown in FIG. 8A, a conductive mask 2p having an opening formed so as to be located only above a p-channel transistor formation region (a first region) is placed above the silicon substrate 11 and then phosphorous ions (P$^+$) are implanted into the substrate at 100 to 200 Kev and at a dose of $2\times10^{13}$ cm$^{-2}$ to form selectively a n-type ion-implanted layer 4n.

Next, as shown in FIG. 8B, a conductive mask 2n having an opening formed so as to be located only above an n-channel transistor formation region (a second region) is placed above the silicon substrate 11 and then boron ions (B$^+$) are implanted into the substrate at 100 to 300 Kev and at a dose of $2\times10^{13}$ cm$^{-2}$ to form selectively an p-type ion-implanted layer 4p.

Finally, the ions in the p- and n-type ion implanted layers 4p and 4n are activated through annealing to thereby finish p- and n-type wells.

Figure 9A:
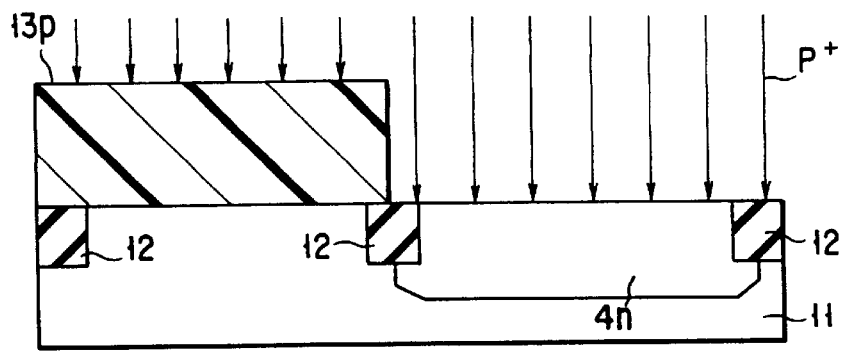
FIGS. 9A and 9B are schematic illustrations, in the order of steps, of a method of forming p- and n-wells of conventional CMOS processing.
Figure 9B:
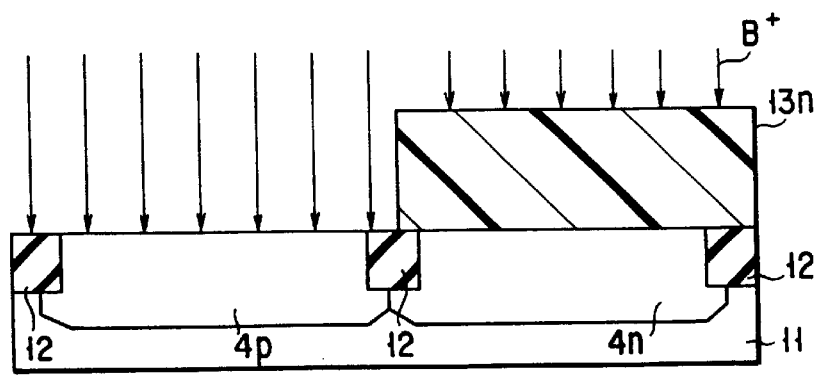

For comparison, in FIGS. 9A and 9B there is illustrated, in sectional view, a conventional method of forming n- and p-type wells.

In the conventional method, as with this embodiment, the device isolation insulating film 12 is formed.

Next, a layer of resist is coated onto the entire surface, exposed to light, and developed to form a resist pattern 13p having an opening formed only above a p-channel transistor formation region in the substrate 11 and then phosphorous ions (P$^+$) are implanted into the substrate at 100 to 600 Kev and at a dose of $2\times10^{13}$ cm$^{-2}$ to form selectively the n-type ion-implanted layer 4n.

Next, the resist pattern 12p is stripped through ashing. After that, a layer of resist is coated again onto the entire surface, exposed to light, and developed to form a resist pattern 13n having an opening formed only above an n-channel transistor formation region in the substrate 11 and then boron ions (B$^+$) are implanted into the substrate at 100 to 300 Kev and at a dose of $2\times10^{13}$ cm$^{-2}$ to form selectively the p-type ion-implanted layer 4p.

Next, the resist pattern 13n is stripped through ashing. Finally, the ions in the p- and n-type ion implanted layers 4p and 4n are activated through annealing to thereby finish p- and n-type wells.

Thus, the conventional method requires two repetitions of each of steps of coating a layer of resist, exposing it to light, developing it, and stripping it. In comparison with this embodiment, therefore, the number of steps involved and the cost increase.

Seventh Embodiment

Figure 10A:
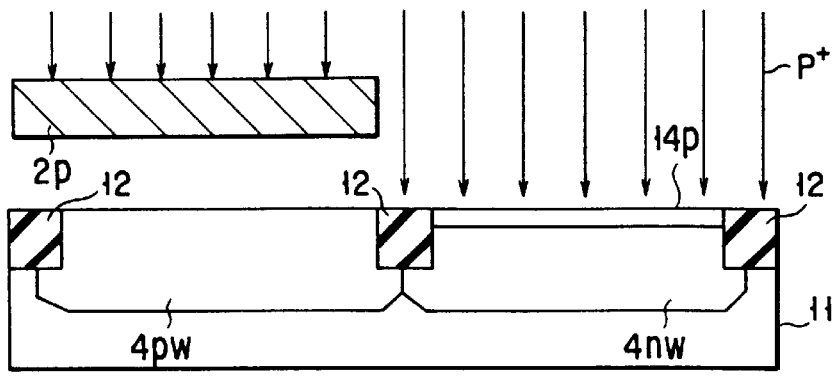
FIGS. 10A and 10B are schematic illustrations, in the order of steps, of a method of forming p- and n-channel doped layers in CMOS processing in accordance with a sixth embodiment of the present invention.
Figure 10B:
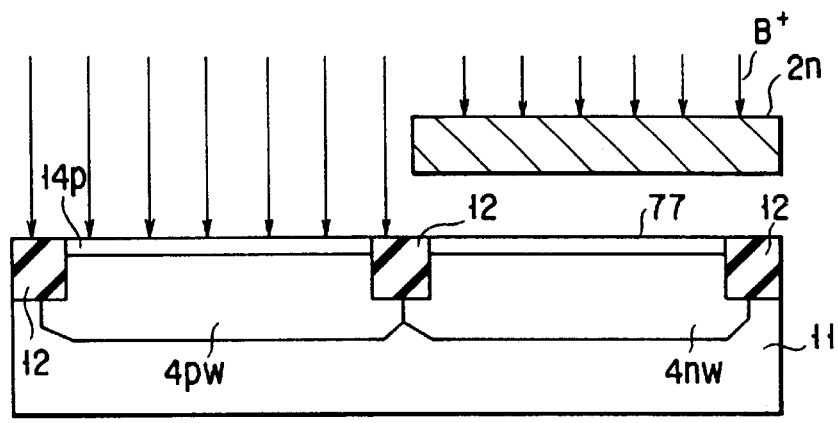

FIGS. 10A and 10B show, in sectional view, a method of forming p- and n-type doped channel layers in manufacturing CMOS devices in accordance with a seventh embodiment of the present invention.

First, as in the sixth embodiment, the device isolation insulating film 12, a p-type well 4pw and an n-type well 4nw are formed in the silicon substrate 11 as shown in FIG. 10A.

Next, as shown in FIG. 10A, a conductive mask 2p having an opening formed so as to be located only above a p-channel transistor formation region in the substrate is placed above the silicon substrate 11 and then phosphorous ions (P$^+$) are implanted into the substrate at 80 to 130 Kev and at a dose of $2\times10^{13}$ cm$^{-2}$ to form selectively a n-type ion-implanted layer 14n in the surface of the n-type well 4nw.

Next, as shown in FIG. 10B, a conductive mask 2n having an opening formed so as to be located only above an n-channel transistor formation region is placed above the silicon substrate 11 and then boron ions (B$^+$) are implanted into the substrate at 30 to 80 Kev and at a dose of $1\times10^{13}$ cm$^{-2}$ to form selectively an p-type ion-implanted layer 14p in the surface of the p-type well 4pw.

Finally, the ions in the p- and n-type ion implanted layers 14p and 14n are activated through annealing to thereby finish p- and n-type doped channel layers.

Eighth Embodiment

Figure 11:
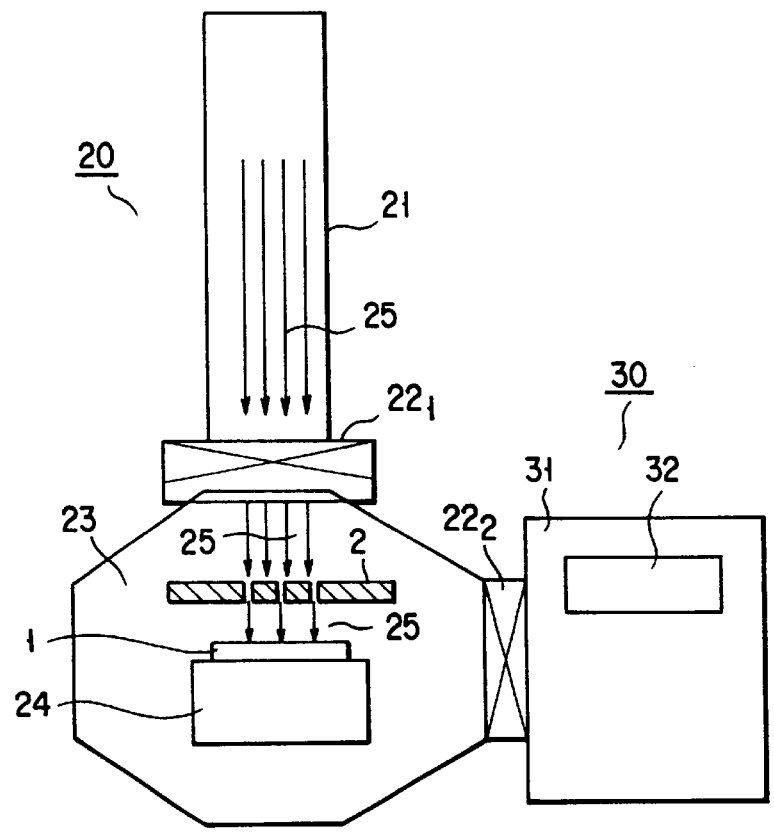
FIG. 11 is a schematic illustration of a semiconductor device manufacturing system for forming impurity implanted layers in accordance with an eighth embodiment of the present invention.

FIG. 11 is a schematic representation of a semiconductor device manufacturing system for forming impurity doped layers in accordance with an eighth embodiment of the present invention.

The semiconductor manufacturing system is constructed roughly from an ion implantation apparatus 20 and thermal processing apparatus 30. In FIG. 11, 21 denotes a beam line chamber of the ion implantation apparatus 20, which is coupled through a first gate valve 221 with an end station chamber 23.

The end station chamber 23 is equipped with a substrate holder 24 of high thermal capacity, which is formed of a material of high specific heat, such as SiC, VC, BN, or TiC. The substrate holder 24 is coated on top with a film of high thermal conductivity such as AlN. A semiconductor substrate 1 is placed and held on the holder 24.

The substrate holder 24 can be precooled to 0° C. or below as required by means of a cooling facility not shown. It is desirable that the cooling temperature is −130° C. or below. Such low temperatures allows for easy control of defects during the ion implantation step and effective suppression of the formation of defect clusters.

Within the end station chamber 23, a conductive mask 2 is placed above the semiconductor substrate 1. An ion beam 25 travels through the beam line chamber 21, the first gate valve $22_1$ and then enters the surface of the semiconductor substrate 1 through openings of the conductive mask 2. As a result, ion-implanted layers are formed in the surface of the semiconductor substrate.

The end station chamber 24 is coupled through a second gate valve $22_2$ to a thermal processing chamber 31 of the thermal processing apparatus 30. The end station chamber 24 is evacuated by an evacuation system not shown. The semiconductor substrate 1 within the end station chamber 24 is carried into the thermal processing chamber 31 by a carrying facility not shown. Thus, the semiconductor substrate 1 having ion-implanted layers formed can be transferred into the thermal processing chamber 31 continuously in vacuum.

The thermal processing chamber 31 is equipped with a heating facility 32 comprising infrared lamps, ultraviolet lamps, or a combination thereof. In the thermal processing chamber, the semiconductor substrate having ion-implanted layers formed is rapidly heated by the heating facility at a rate of 100° C./sec or more and then subjected to annealing for 1 to 30 sec at 600 to 1100° C. Consequently, the ions in the ion-implanted layers are activated to form impurity doped regions.

The ion implantation apparatus of this embodiment is intended to implement the ion-implanted layer formation method according to the first embodiment, but it may be modified to implement the other ion-implanted layer formation methods.

Ninth Embodiment

Figure 12:
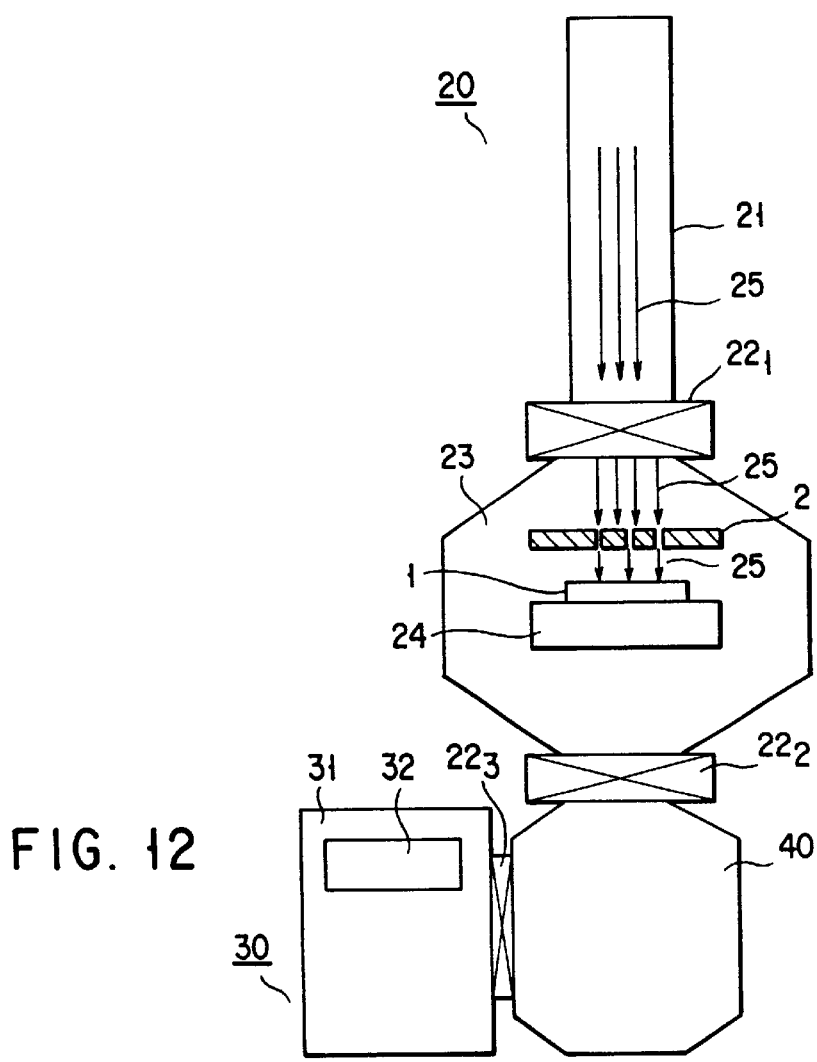
FIG. 12 is a schematic illustration of a semiconductor device manufacturing system for forming impurity implanted layers in accordance with a ninth embodiment of the present invention.

FIG. 12 is a schematic representation of a semiconductor device manufacturing system for forming impurity doped layers in accordance with a ninth embodiment of the present invention.

This embodiment differs from the eighth embodiment in that the end station chamber 24 is coupled with the thermal processing chamber 31 through a carrying chamber 40. In FIG. 12, 22₃ denotes a third gate valve.

In this embodiment, while a first semiconductor substrate is being implanted with ions in the ion implantation apparatus, a second semiconductor substrate having ion-implanted layers already formed is subjected to annealing in the thermal processing chamber. Compared to the eighth embodiment, therefore, the ninth embodiment improves the semiconductor substrate (wafer) processing speed, allowing more impurity doped regions to be formed in a short time.

In addition, since ion implantation is performed without using any resist pattern, the time required to form ion-implanted layers is reduced. In other words, the difference between the ion-implanted layer formation time and the impurity doped layer formation time (the annealing time) is made small enough. That is, immediately after the formation of impurity diffused layers in one semiconductor substrate, another semiconductor substrate can be subjected to annealing. Thus, the formation of ion-implanted layers and the formation of impurity doped layers can be performed in succession.

Tenth Embodiment

Figure 13:
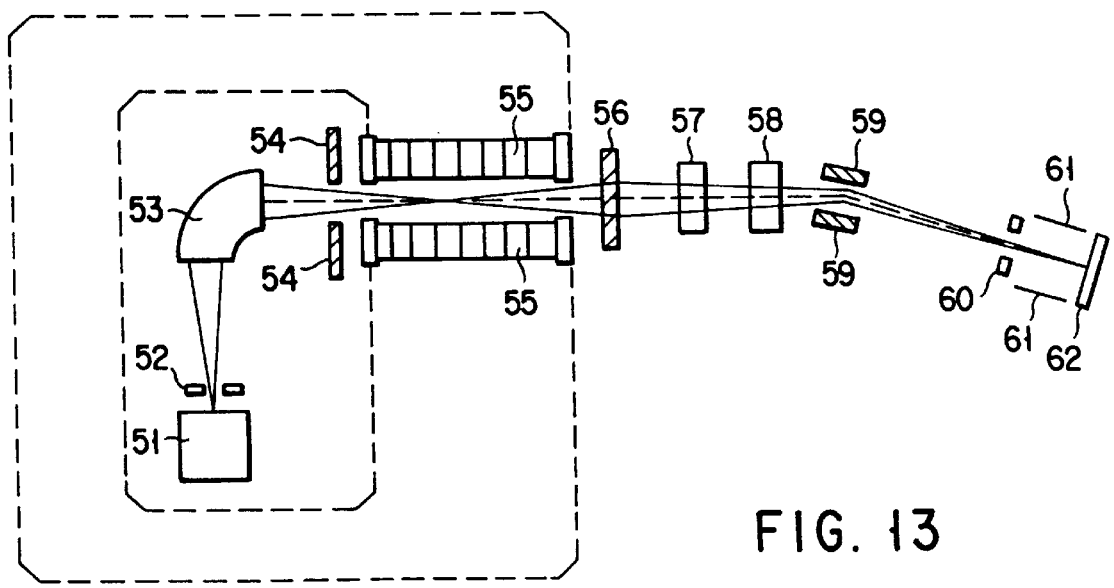
FIG. 13 is a schematic illustration of an ion implantation apparatus.

Reference is made to FIG. 13 to describe the outline of the overall construction of an ion implantation apparatus, an ion generation method, and an ion implantation method. This ion implantation apparatus is characterized by an ion source chamber (arc chamber) 1 as will be described later, but otherwise remains unchanged from conventional ion implantation apparatuses.

In the ion implantation apparatus of FIG. 13, ions are generated in the ion source chamber 1 as will be described in detail later. The ions are taken out of the chamber through an outlet electrode 52 and then introduced into an analyzing magnet 53 where they are separated into each ion species according to charge and mass. The ions passed through the magnet 53 enters a resolving aperture 54 where only the desired ion species is separated out. The desired ion species is accelerated or decelerated by an accelerator 55 to have desired final energy. The ion beam with the desired energy is subjected to focusing control by a focusing lens 56 so as to be focused onto the surface of a sample (e.g., a semiconductor substrate) 62. The ion beam is then scanned across the sample by scanners 57 and 58 so that the sample is doped uniformly over its entire surface. To remove neutral particles resulting from collision with residual gas, the ion beam is bent by a deflector 59 and then impinges on the surface of the sample 62 through a mask 60. Reference numeral denotes apparatus ground.

Figure 14A:
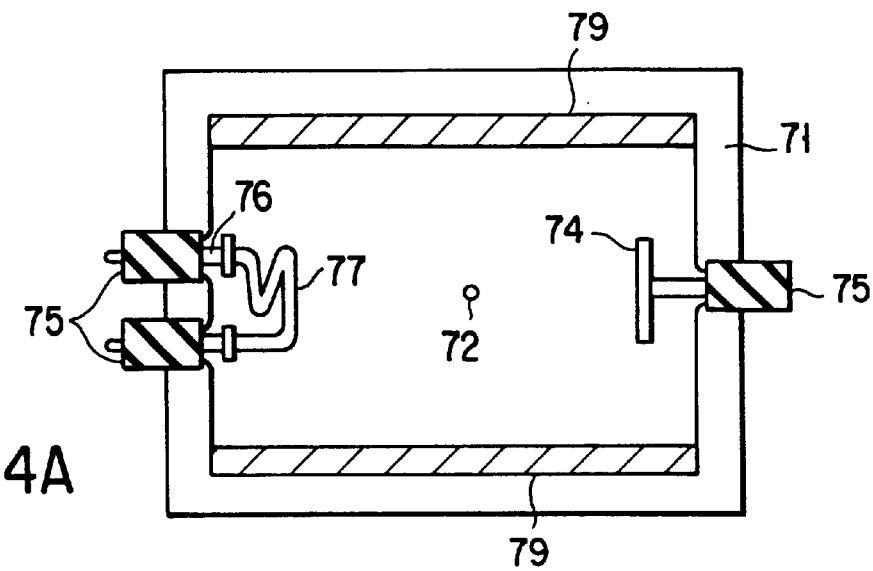
FIGS. 14A, 14B and 14C are schematic illustrations, in sectional view, of a Burnus type ion source chamber having ion source plates loaded into in accordance with a tenth embodiment of the present invention.
Figure 14B:
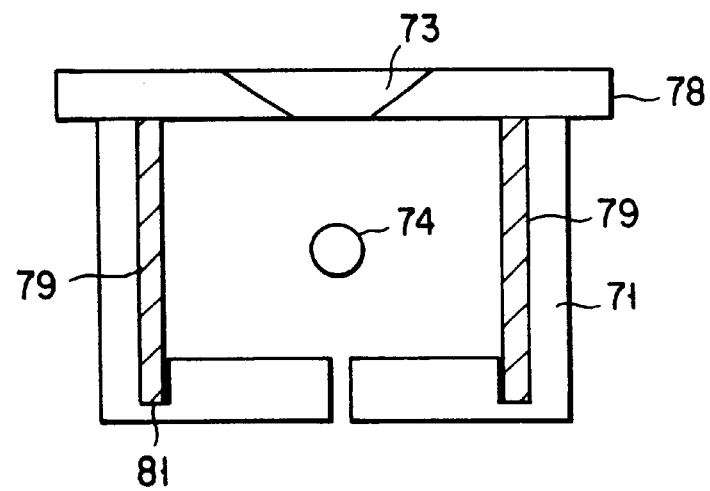
Figure 14C:
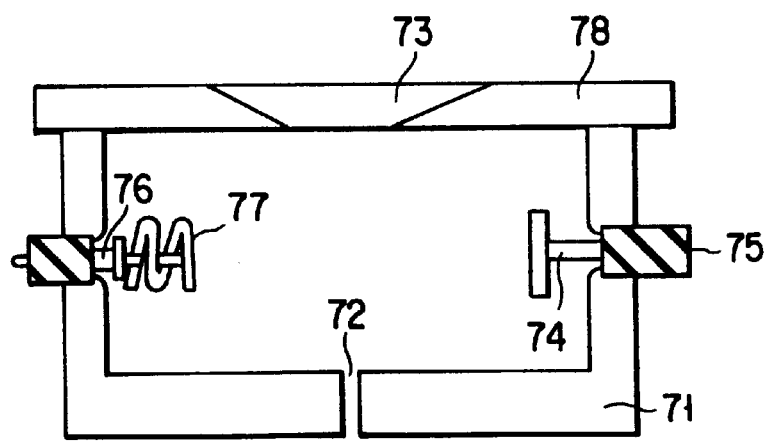

FIGS. 14A to 14B are sectional views of a Burnus type ion source chamber according to a tenth embodiment of the present invention, which has material members 79 built in. More specifically, FIG. 14A is a sectional view taken parallel to top of the chamber, FIG. 14B is a cross-sectional view, and FIG. 14C is a longitudinal-sectional view of the chamber.

Figure 19A:
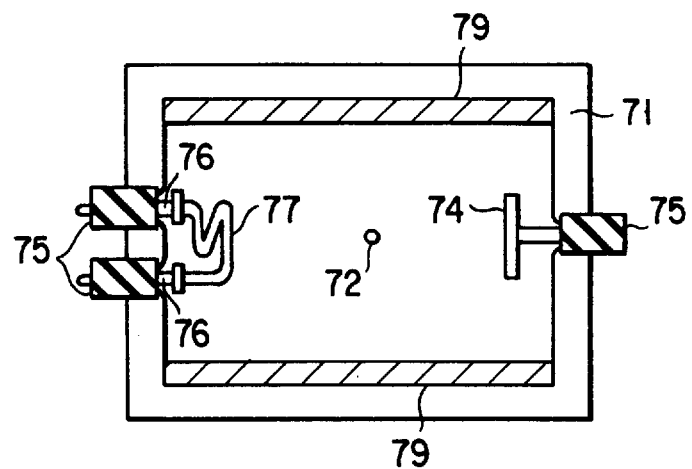
FIGS. 19A, 19B and 19C are schematic sectional views of an improved Burnus type ion source chamber.
Figure 19B:
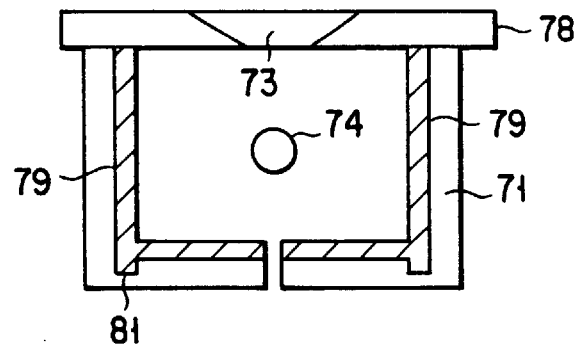
Figure 19C:
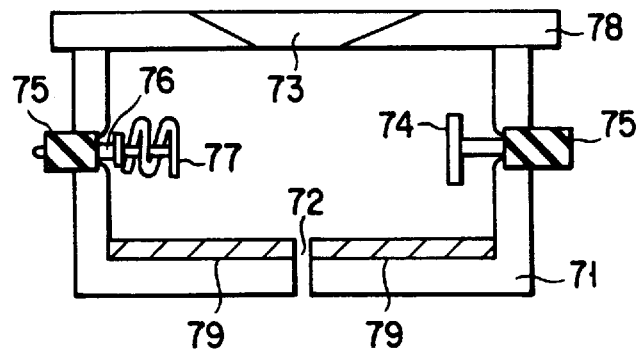

This ion source chamber remains unchanged basically from the conventional Burnus type ion source chamber shown in FIG. 19. That is, on one end surface of an arc chamber 71 formed mainly of tungsten is mounted a tungsten filament 77 with insulating supports 75 and reflectors (spacers) 76. On the opposite end surface of the chamber is mounted an opposed electrode 74 with an insulating support 74. An Ar gas is supplied through a gas inlet 72, and desired ions are taken out of the chamber through an ion outlet 73 provided in a front plate 78.

The ion source chamber 71 is usually set so that the ion outlet 73 is at the top and the gas inlet 72 is at the bottom.

The ion generator of this embodiment has slits 81 formed along the inner walls of the arc chamber 71. Material plates (ion source plates) 79 from which a desired ion species is ejected are removably inserted into these slits. To obtain another ion species, therefore, one merely changes the ion source plate. A plasma of Ar gas is generated by thermal electrons emitted from the filament 77 and a desired ion species is ejected from the ion source plates 79 by the sputtering action of the Ar gas.

Although the ion source plate has only to be placed on at least part of the inner walls of the arc chamber 71, it is more preferable that the ion source plate be placed on at least one of the four inner walls other than a pair of opposed inner walls on which the filament 77 and the electrode 74 are mounted. In addition, although it is sufficient to place the ion source plate at least on part of a placement wall, for better sputtering efficiency it is recommended to place it on the entire placement wall.

Next, the ion generation method and the ion irradiation method of this embodiment will be described taking indium as an example.

In this embodiment, an InSb monocrystalline substrate is used as the ion source plate. The InSb substrate is high in melting point, unlike elemental indium having a melting point of 156° C. In addition, it is industrially available and stable at a normal temperature. Further, it is very stable in composition because it is monocrystalline.

In this embodiment, the InSb substrate is placed on a pair of side walls and the bottom surface. After predetermined startup procedure, an Ar gas is introduced through the gas inlet 72 and thermal electrons are released from the filament 77. As a result, a plasma of Ar gas is generated and Sb and In are ejected from the InSb substrate by the sputtering effect of particles in the plasma and then ionized by discharge. The generated Sb ions, In ions and Ar ions are taken out through the outlet 73. Only the In ions are separated out by an analyzing magnet and then implanted into a sample.

In this case, an about 4-MA beam current is obtained stably for about 50 hours (tenfold longer than the prior-art value) at 180 KEV.

As described previously, when a vapor obtained by heating $InCl_3$ to 330° C. is introduced into the conventional ion source chamber for ionization, many abnormal discharge events come to occur in about five hours, disabling ion implantation.

The arrangement of the present invention allows ion implantation to be performed very stably for a long period of time.

Although the embodiment has been described as using In or Sb as a metal to be ionized, the present invention is applicable to ion implantation of many other metals which have danger of melting in the ion chamber which can form stable compounds. For example, such metals include aluminum (melting point: 660° C.), gallium (30° C.), thallium (303° C.), tin (232° C.), lead (328° C.), zinc (420° C.), and cadmium (321° C.). In particular, the group III elements form stably compounds with the group V elements and are thus easy to use. Various III–V compounds, such as InAs, GaAs, etc., are available for stable generation of ions. Likewise, the II–VI compounds, such as ZnSe, CdTe, etc., are also available. Sn and Pb, which are the group IV elements, are available in the form of Sn oxides and Pb oxides which are higher in melting point than pure Sn and Pb.

The material of ion source plates used need not be limited to one kind of material. Ion source plates made of different materials, such as GaAs and InSb, may be placed on different inner walls of the chamber. In that case, different kinds of elements can be ionized at the same time and their ions can be separated from one another by the analyzer magnet on the basis of their mass. This allows for the selection of ions to be implanted.

Eleventh Embodiment

The tenth embodiment can generate In ions continuously over a period of time that is approximately ten times as long as the conventional chamber.

With the tenth embodiment, however, when the ion generation lasts over 50 hours, abnormal discharges will occur.

Our repeated examinations of the occurrence of abnormal discharges revealed that the remains of the In metal were seen on the inner walls of the arc chamber though elemental In was not used. In addition, it was seemed that strong abnormal discharges occurred particularly when the In metal was seen around the filament and the electrode.

For this phenomenon it appeared that, as a result of continuation of discharge with InSb as a source material, Sb higher in vapor pressure evaporates earlier than In with the result that In becomes excessive, and the elemental In metal forms, melts, and migrates within the arc chamber. It was presumed that a discharge path is formed locally when In comes around the filament and the electrode and as a result abnormal discharge occurs frequently. According to our analyses, under the above conditions (180A, 4MA), the temperature within the chamber was estimated to rise to 500 to 800° C. when the chamber measures 220 ML (the volume of tungsten which is the chamber material is 100 ML). It was therefore expected that not only In but most of the above-described metals of low melting points will melt.

To solve the above problem, a nitrogen gas was introduced into the arc chamber in addition to the Ar gas. By the introduction of nitrogen gas, In that remained excessively on the InSb surface was nitrided into InN in the form of a solid, which cannot migrate.

With such a method, the nitrided InSb surface is always refreshed by sputtering and thus the sputtering rate of each element is not subject to variation.

The introduction of nitrogen into the arc chamber in addition to the Ar gas allows the ion generation and radiation to be performed more stable.

This embodiment may be modified so as to place an InN substrate in the arc chamber and introduce an inert gas or a mixture of an inert gas and a nitrogen gas into the arc chamber for discharge. This modification will also provide the above-described advantages.

Twelfth Embodiment

Figure 15A:
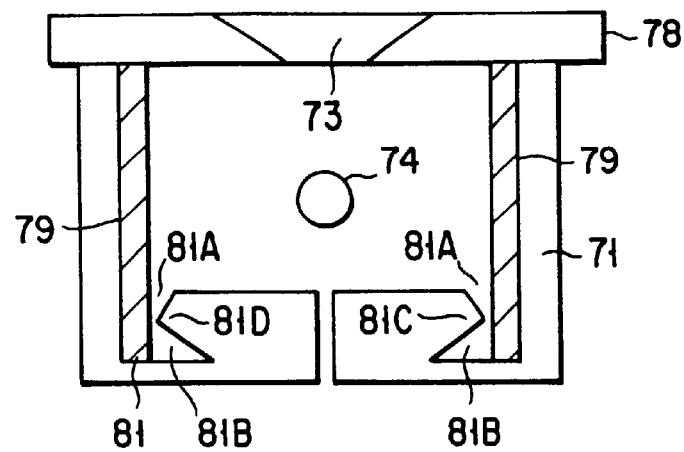
FIGS. 15A, 15B and 15C are schematic cross-sectional views of arc chambers according to a twelfth embodiment of the present invention.
Figure 15B:
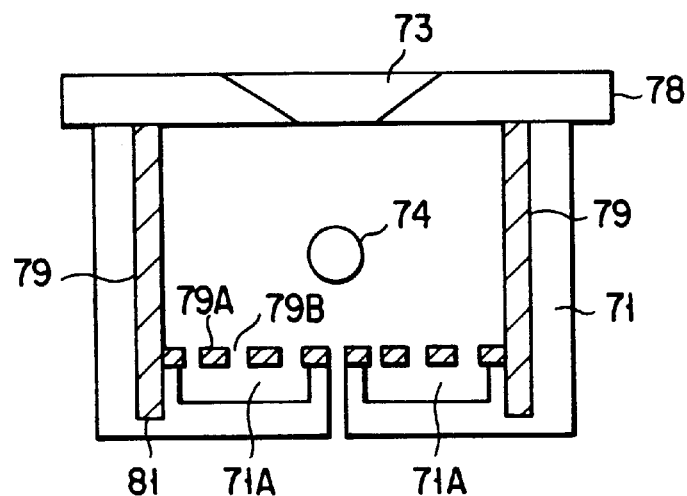
Figure 15C:
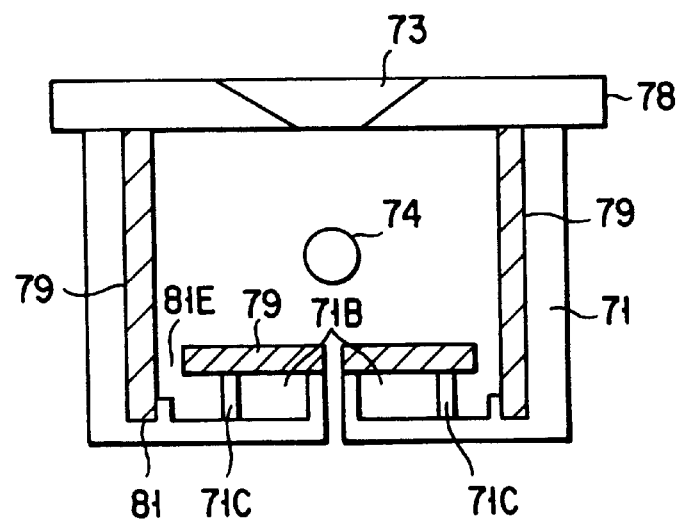
Figure 16A:
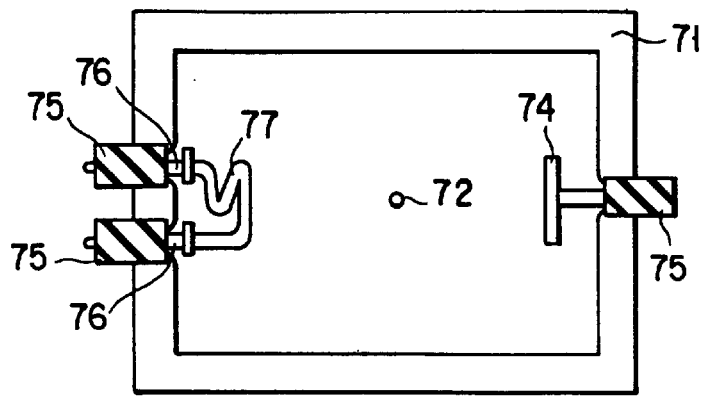
FIGS. 16A and 16B are schematic sectional views of a conventional Burnus type ion source chamber.
Figure 16B:
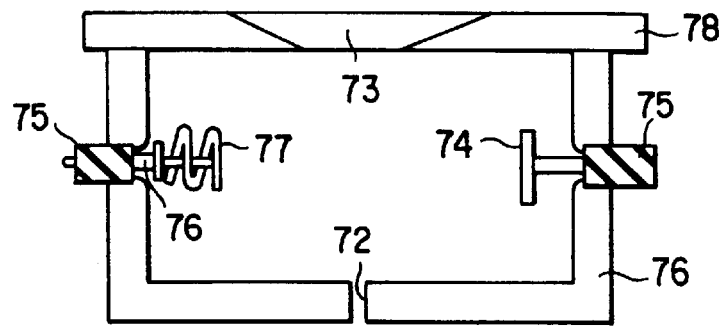
Figure 17A:
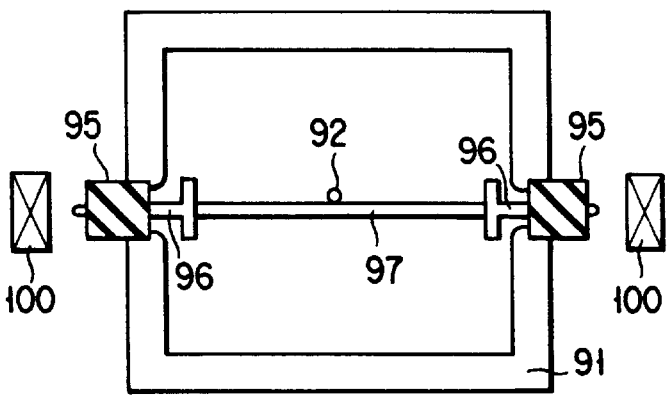
FIGS. 17A and 17B are schematic sectional views of a conventional Freeman type ion source chamber.
Figure 17B:
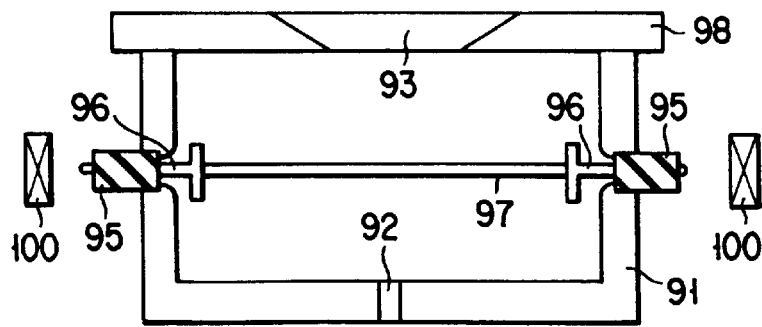
Figure 18:
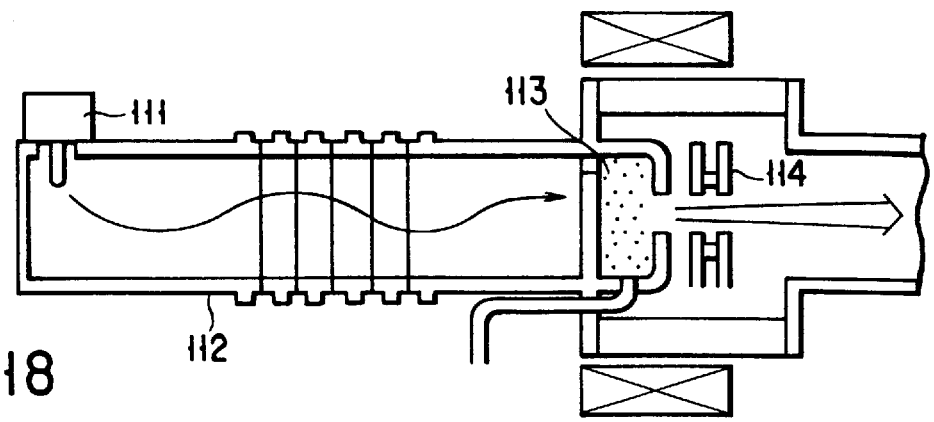
FIG. 18 is a schematic sectional view of a conventional microwave type ion source chamber.

FIGS. 15A, 15B and 15C, in correspondence with FIG. 14B, show cross sections of arch chambers according to a twelfth embodiment of the present invention in which accommodations are made in the structure of the arc chamber. In these figures, like reference numerals are used to denote corresponding parts to those in FIG. 14B.

In the arc chamber of FIG. 15A, the ion source plates 79 are put on the opposed inner walls of the chamber but not on the bottom. In this embodiment, each plate is fixed inserted into the slit 81, which, unlike the previously described embodiments, is formed deep. In the portion of the slit 81, an upper slope 81A is formed so that the slit widens upward.

In the portion of the slit 81, a lower slope 81B is formed so that the slit widens downward. Through-holes 81D are formed so that the upper slope 81A and lower slope 81B partially connect each other.

The result of ion generation using this arc chamber was that excessive In metal formed on the InSb surface flowed from the upper slope 81A through the through-holes 81D to the lower slope 81B and stayed there. Thus, the occurrence of abnormal discharges was prevented.

This arc chamber is effective even if it is formed with only the upper slope 81A. In addition, even if the upper slope 81A is not formed, it is sufficient to form the lower slope 81B and passages that allow liquid to flow into that slope. Note that the shape of the upper and lower slopes shown in FIG. 15A is merely exemplary.

In the example shown in FIG. 15B, a material plate 79A that is the same as the plates 79 is placed at the bottom as well. This plate 79A is a perforated plate formed with small holes 79B over the entire surface. The arc chamber is formed with recesses 71A under the perforated material plate 79. This configuration allows In in liquid form produced on the surface of the plates 79 and 79A to flow through the holes 79B into the recesses 71, preventing exposure to plasma and abnormal discharges.

In the example of FIG. 15C, unlike the example of FIG. 15B, no holes are formed in the plate 79. In this embodiment, a space 81E is provided between the side material plates 79 on the one hand and the bottom material plate 79b on the other hand. Further, an inner part of the bottom material plate 79b is removed by scraping, except those portions to become posts 71C, thereby forming traps for storing liquid such as liquid indium (In).

As described above, the twelfth embodiment aims to prevent exposure of such a metal in liquid form as In to plasma by allowing it to fall under the material plate.

The twelfth embodiment may be modified such that, instead of providing a trap for a metal in liquid form, a cover in mesh form made of a refractory metal, such as tungsten or molybdenum, is placed on the ion source material. Because of high surface tension, a liquid such as of In condenses around a material, such as tungsten, of the mesh with no spattering. Unlike the above-described configurations of the twelfth embodiments, this modification eliminates the need of processing the arc chamber. The mesh cover has only to be made of a metal of higher melting point than a metal in liquid form produced from the ion source plate. In view of temperature rise in the arc chamber, it is desirable to use a metal having a melting point of 1000° C. or above.

Thirteenth Embodiment

Next, a method of implanting more than one kind of ions into a semiconductor substrate using the ion generation methods of the tenth to twelfth embodiments will be described with reference to FIG. 13 and FIGS. 14A, 14B and 14C. In this description sequential ion implantation of In ions and Sb ions is taken as an example.

First, as shown in FIGS. 14A, 14B and 14C, InSb plates as material members 79 are loaded into the arc chamber 71 and then an Ar gas is introduced into the arc chamber through the gas inlet 72. Thermal electrons are released from the tungsten filament 77 and then deflected by the opposed electrode 41 from the direction of emission from the filament to the reverse direction to increase the probability of collision with the Ar gas for ionization of In and Sb. The resulting In ions and Sb ions are taken out through the ion outlet 73 formed in the front plate 78.

Next, as shown in FIG. 13, the In ions and Sb ions are led by the extraction electrode 52 adjacent to the arc chamber into the analyzing electromagnet 53, where only the In ions are separated out by mass so as to pass through the slit 4. The In ions separated out by the slit are accelerated or decelerated by the accelerator 55 up or down to desired final energy. The In ion beam is focused by the four-electrode lens 56 onto the surface of a sample 62 (e.g., a semiconductor substrate). Subsequently, the In ion beam is scanned by the scanning electrodes 57 and 58 so that the implant dose becomes uniform over the entire surface of the sample. To remove neutral particles resulting from collision with residual gases, the ion beam is bent by the deflector electrode 59. As a result, desired areas of semiconductor substrate regions where semiconductor devices are to be formed are irradiated with the In ion beam through openings of the mask 60. Reference numeral 61 denotes apparatus ground.

At this point, the sample has its desired areas alone made open to the ion beam and its other areas masked by the mask 60.

After the termination of implantation of the In ions, the mask is exchanged and the applied voltage to the electromagnet 53 is changed to thereby allow the Sb ions to enter the slit 54. Ion implantation is performed again. Thus, other desired areas than the In-ion implanted areas can be implanted with the Sb ions.

This method allows N-type doped regions and P-type doped regions to be formed in the semiconductor substrate in succession without changing the material in the arc chamber.

Although the embodiments have been described in terms of the generation of In ions, the amount of Sb, a constituent element of the InSb material plate, introduced into a silicon substrate was sufficient to act as impurities in it. This is the case with In.

In the case of GaAs, InAs and GaSb plates as well, a desired amount of impurity was obtained for each of the group III and V elements.

The embodiments illustrated in FIGS. 10 to 14 can be applied to the manufacture of semiconductor substrates, i.e., ion implantation.

For example, MOS transistor diffused layers can be formed by introducing In ions into a semiconductor elements. In particular, an attempt to introduce doubly charged ions of In into a semiconductor substrate under conditions of ionization in $InCl_3$ or an organic gas causes an additional problem that Fe is released from an oven or gas pipe and then ionized. Fe is very difficult to be mass analyzed by the analyzing electromagnet because its radius of curvature is in agreement with that of the doubly charged ions of In. When introduced into the semiconductor substrate, Fe degrades the characteristics of pn junctions.

Thus, the sputtered ion implantation of the present invention causes no problem of contamination and permits impurities to be introduced into a semiconductor substrate very easily and stably.

Although the tenth through fourteenth embodiments was described as using AR as a support gas for sputtering, alternative support gases may be used. For the filament and the chamber, other materials than tungsten, such as graphite, may be used.

Furthermore, although the tenth through thirteenth embodiments was described as using the Burnus type ion source, other types of ion sources may be used.

Fourteenth Embodiment

Figure 20:
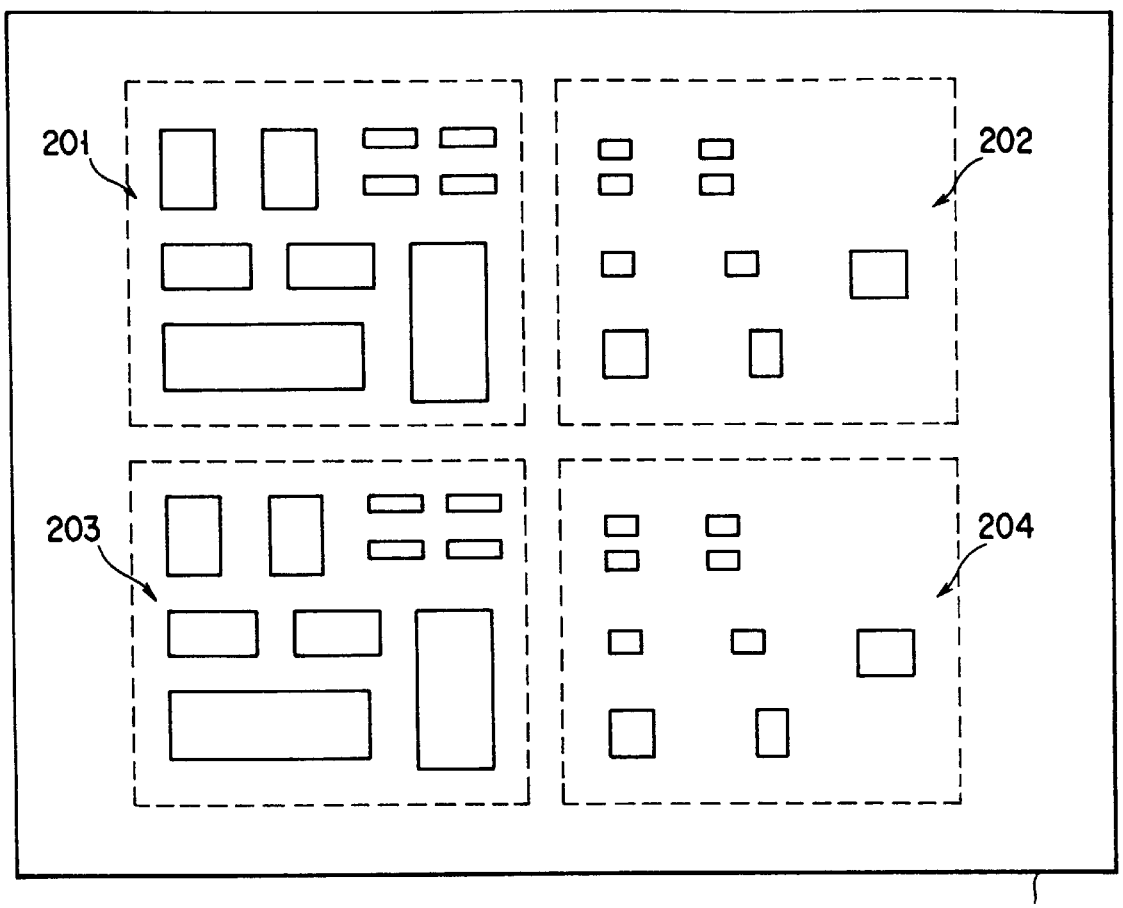
FIG. 20 is a plan view of a conductive mask according to a fourteenth embodiment of the present invention.

FIG. 20 is a plan view of a conductive mask according to a fourteenth embodiment of the present invention. In this figure, 200 denotes a conductive mask, which has four mask areas 201 to 204. The mask areas 201 and 203 are identical to each other in opening pattern. This is the case with the mask areas 202 and 204. The mask areas 201 and 202 are different from each other in opening pattern. The dimensions of each of the mask areas corresponds to the size of an integrated-circuit chip.

That is, n (an natural number) number of mask areas the size of an integrated-circuit chip are present in the same conductive mask, and two adjacent mask areas are different in opening pattern. In other respects this conductive mask remains unchanged from the conductive mask described in the first embodiment.

When a semiconductor substrate (wafer) is of silicon, ions of dopants, such as B, Ga, In, As, and Sb, are implanted into the surface of the substrate or wafer through the conductive mask 200. The dose is set to between $1\times10^{10}$ and $1\times10^{14}$ $cm^{-2}$.

Figure 21:
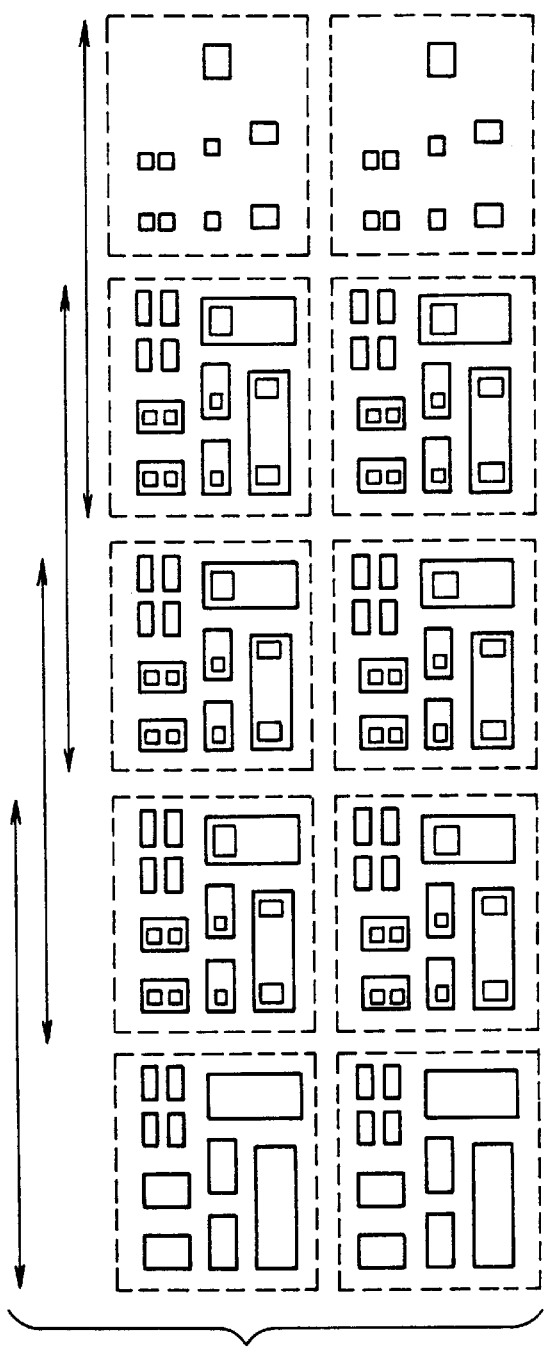
FIG. 21 is a diagram for use in explanation of an ion implantation method using the conductive mask of FIG. 20.

At this point, as shown in FIG. 21, ion implantation is performed while the stage (not shown) on which a semiconductor substrate (wafer) is placed is shifted so that the same region (an integrated circuit formation region) of the semiconductor substrate or wafer is successively subjected to ion implantation through the first half (201) and the second half (202) of the conductive mask which are different in opening pattern. That is, the surface of the silicon substrate or wafer is implanted with impurity ions selectively and successively through the mask area 201 (203) and the mask area 202 (204).

The final pattern of each region subjected to successive ion implantation steps in this way corresponds to a superimposition of the opening pattern of the mask area 201 (203) and the opening pattern of the mask area 202 (204) as shown in FIG. 21.

In FIG. 21 there is illustrated a pattern when the stage is shifted only in the x direction, but in practice the stage is shifted in the y direction as well.

Such a method allows transistors with different threshold voltages to be fabricated locally in the same chip without any lithographic processes by making a difference between the dose of first impurity ions to be implanted through the mask area 201 (203) and the dose of second impurity ions to be implanted through the mask area 202 (204).

The first impurity ions and the second impurity ions may be the same species or different species. In the case of different species, by using a target consisting of a compound of a group III element and a group V element, such as InSb, converting each of the group III element and the group V element in the target into gas, and ionizing these gases at the same time in the ion chamber, the group III element (In) and the group V element (Sb) can be alternately implanted. For conversion of the group III element and the group V element into gas, use is made of evaporation means such as heating based on sputtering or thermal electron.

With the method described above, the endmost chips on the wafer are merely to subjected to a single ion implantation through the mask areas 201 and 203 or the mask areas 202 and 204.

To solve this problem, the stage is shifted so that the mask areas 201 and 203 or 202 and 204 of the conductive mask 200 are located above the endmost chips. In other words, the mask areas 201 and 203 or 202 and 204 are located outside the wafer. In this manner, each chip can be subjected to two ion implantations.

Figure 22:
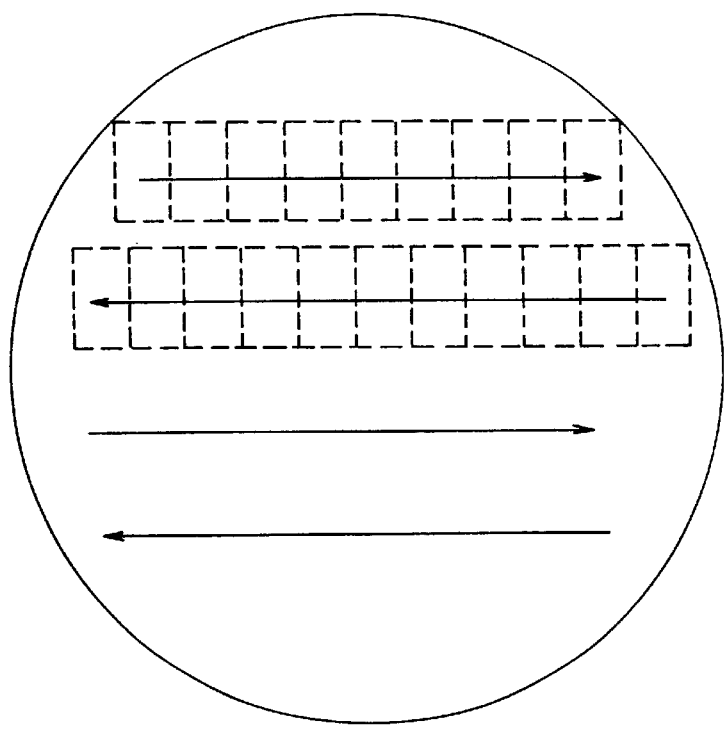
FIG. 22 is a diagram for use in explanation of a method of minimizing the time of shifting the stage.

In order to minimize the time of shifting the stage, it is desirable to perform ion implantation successively while the stage goes and returns as shown in FIG. 22.

Fifteenth Embodiment

Figure 23:
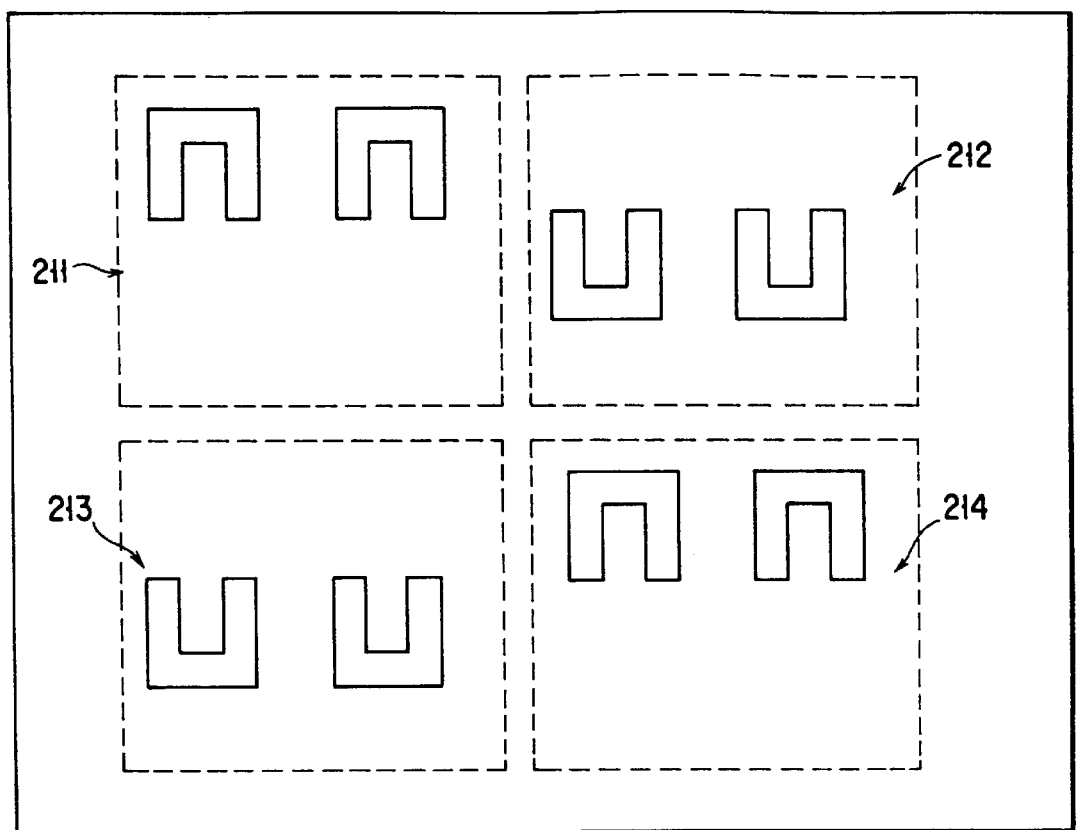
FIG. 23 is a plan view of a conductive mask according to a fifteenth embodiment of the present invention.

FIG. 23 is a plan view of a conductive mask according to a fifteenth embodiment of the present invention. In this figure, 210 denotes a conductive mask, which has four mask areas 211 to 214. The mask areas 211 and 214 are identical to each other in opening pattern. This is the case with the mask areas 212 and 213. The mask areas 211 and 212 are different from each other in opening pattern. The dimensions of each of the mask areas corresponds to the size of an integrated-circuit chip.

That is, n (an natural number) number of mask areas the size of an integrated-circuit chip are present in the same conductive mask, and two adjacent mask areas are different in opening pattern. When two mask areas that adjoin to each other laterally (in the x direction) are superimposed upon each other, openings are formed so that they have inner and outer peripheries of a rectangular shape. In other respects this conductive mask remains unchanged from the conductive mask described in the first embodiment.

When a semiconductor substrate (wafer) is of silicon, ions of dopants, such as B, Ga, In, As, and Sb, are implanted into the surface of the substrate or wafer through the conductive mask 210. The dose is set to between $1 \times 10^{10}$ and $1 \times 10^{14}$ cm$^{-2}$.

Figure 24:
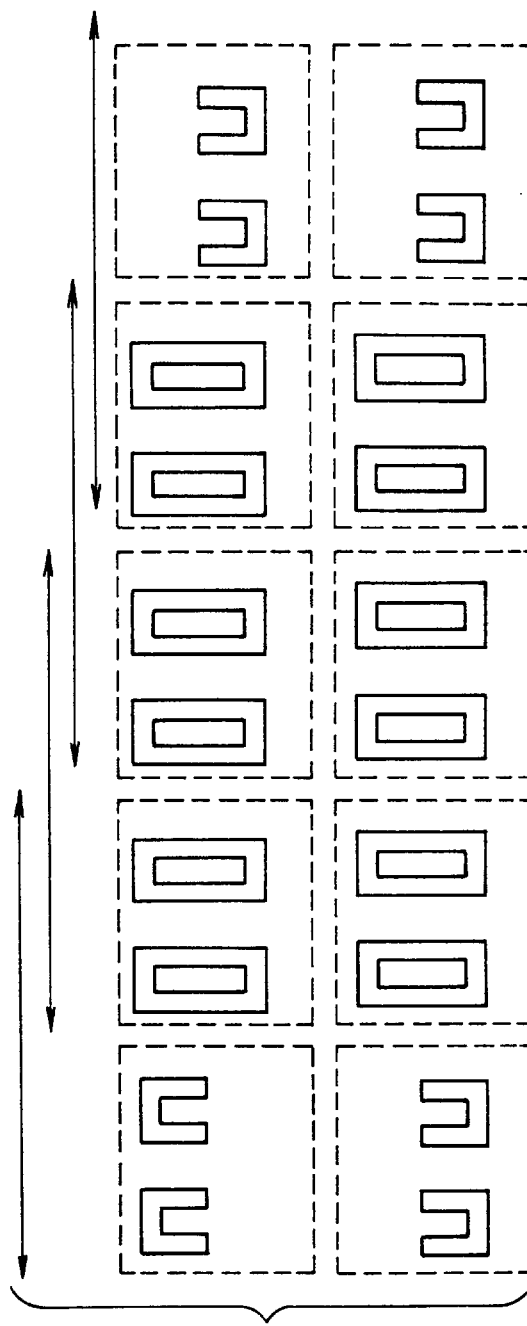
FIG. 24 is a diagram for use in explanation of an ion implantation method using the conductive mask of FIG. 23.

At this point, as shown in FIG. 24, ion implantation is performed while the stage (not shown) on which a semiconductor substrate (wafer) is placed is shifted so that the same region (an integrated circuit formation region) of the semiconductor substrate or wafer is successively subjected to ion implantation through the first half (211) and the second half (212) of the conductive mask which are different in opening pattern. That is, the surface of the silicon substrate or wafer is implanted with impurity ions selectively and successively through the mask area 211 (213) and the mask area 212 (214).

The final pattern of each region subjected to successive ion implantation steps in this way corresponds to a superimposition of the opening pattern of the mask area 211 (213) and the opening pattern of the mask area 212 (214) as shown in FIG. 24.

The use of such an ion implantation method makes it possible to realize a circuit in which p-channel or n-channel MOS transistors are located around an n-channel or p-channel MOS transistor.

In this case as well, the method described in connection with the fourteenth embodiment is carried out to allow each chip to be subjected to two ion implantations through the two different mask areas. Likewise, to minimize the time of shifting the stage, ion implantation is performed successively while the stage goes and returns.

In this embodiment and the fourteenth embodiment, the final pattern of each ion implanted region corresponds to a superposition of the opening patterns of two mask areas. Alternatively, three or more mask areas may be used so that their opening patterns are superimposed upon one another. In this case, these opening patterns differ from one another. In addition, these mask areas are arranged laterally. The conditions of ion implantation (e.g., the dose and the conductivity type of impurities) vary with the mask areas.

Sixteenth Embodiment

Figure 25:
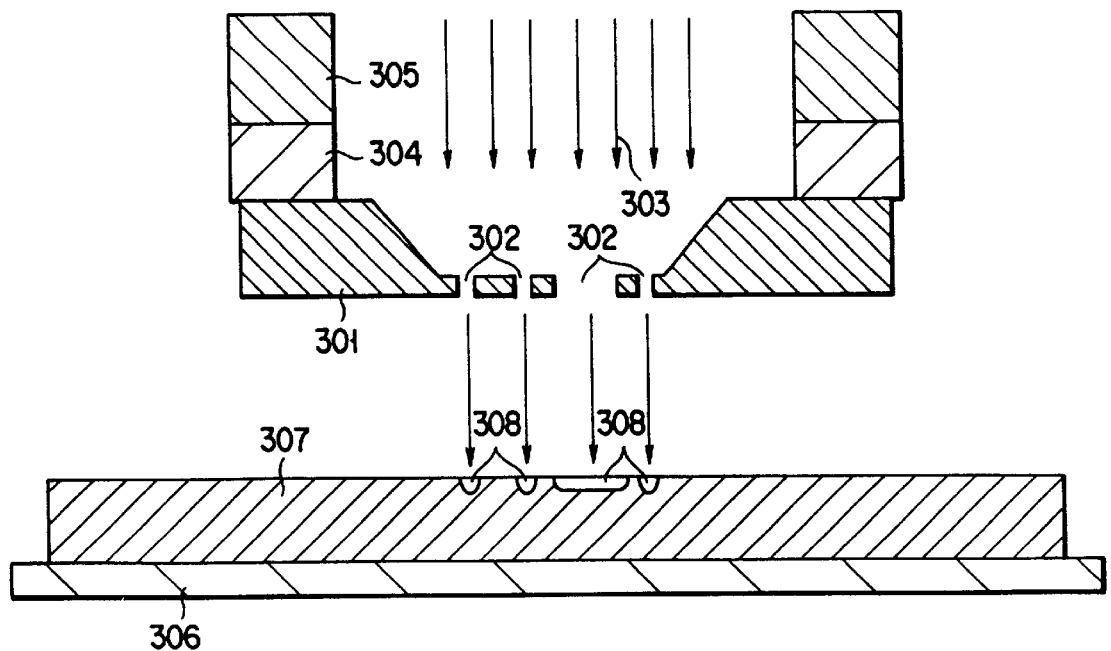
FIG. 25 is a schematic representation, in sectional view, of an ion-implanted layer formation method according to a sixteenth embodiment of the present invention.

FIG. 25 is a schematic illustration, in sectional view, of a method of forming ion-implanted layers in accordance with a sixteenth embodiment of the present invention. In this figure, 301 denotes a conductive mask, 302 denotes openings, 303 denotes an ion beam, 304 denotes an electrostatic chuck, 305 denotes a support, 306 denotes an electrostatic chuck, and 307 denotes a semiconductor substrate (wafer).

When the ascending temperature of the conductive mask 301 becomes 5° C. and that area of the conductive mask which is not held by the electrostatic chuck 304 which has formed with the openings 302 measures 20 to 30 mm, the conductive mask will expand by about 0.3 to 0.45 µm. In that case, it becomes difficult to perform mask alignment to an accuracy of less than 0.3 µm. For high accuracy mask alignment, therefore, it is required to cool the conductive mask with a cooling medium such as water or organic liquid.

In this embodiment, to enhance the cooling efficiency, the conductive mask 301 is chucked by the electrostatic chuck 304 coated on top with a high thermal conductivity material, such as AlN, and having surface irregularities below 2 to 3 µm.

The electrostatic chuck 304 is supported by the support 305 made of a metal, such as MO, W, Nb, Ta, Ti, or ZrsHf, that has a thermal expansion coefficient of less than 10 ppm/K and is high in thermal conductivity. The support 305 is formed with a passage (not shown) through which the cooling medium passes to thereby cool the conductive mask 301 chucked by the electrostatic chuck 304.

The ion beam 303 is implanted through the conductive mask 301 into desired regions 308 in the semiconductor substrate 307. The conductive mask 301 is chucked by the electrostatic chuck 304 cooled. The electrostatic chuck 306 is formed of SiC, BN, VC, or TiC. The electrostatic chuck 306 is coated with a smooth AlN film having surface irregularities of 2 to 3 µm or less. It is desirable that the cooling temperature of the electrostatic chuck 306 be lower than that of the conductive mask 301.

When the cooling temperature of the semiconductor substrate 307 is set to 0° C., preferably −130° C. or below, and more preferably to −180° C., it becomes possible to lower the heating temperature required for recovery of defects produced in the semiconductor substrate 307 by ion implantation to 800° C. or below.

Seventeenth Embodiment

In this embodiment, a stage driving system used to move a semiconductor wafer will be described. As will be described below, this embodiment allows the stage driving system to have little degasification and increased durability.

Parts required to move the stage, such as pole screws, are usually greased. This is because it is required to rotate such parts with little friction.

However, when grease is used, carbon-hydrogen-based or carbon-fluorine-based high molecules contained in the grease evaporate in vacuum. The evaporated high molecules (degasification) are adsorbed on the semiconductor substrate and then knocked on in the semiconductor substrate as impurities upon ion implantation.

To avoid degasification, one might suggest using a solid lubricant, such as a Teflon film, instead of grease. However, contact of the Teflon film with bearings causes too large a friction at about $10^5$ rpm, making rotation failures and disabling the stage from moving.

Figure 26:
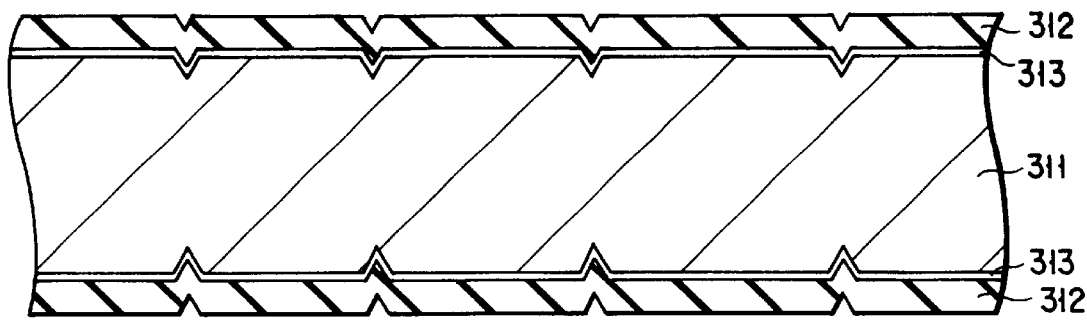
FIG. 26 is a diagram for use in explanation of a stage driving system according to a seventeenth embodiment.

To solve this problem, in this embodiment, a film 312 of fluorine resin, such as a Teflon film, was coated onto a stainless member 311 with surface irregularities by means of spraying to a thickness of 0.3 to 0.5 µm. After that, carbon ions were implanted into the stainless member at 30 to 60 keV and at a dose of $10^{15}$ to $10^{16}$ cm$^{-2}$. In FIG. 26, 313 denotes a mixed layer of carbon ions and fluorine resin.

After the ion implantation, a thermal process was carried out at 100 to 150° C. A similar bearing test confirmed that no stage failure occurs even at $10^7$ rpm or more. Even with fluorine ions, when the acceleration energy was set to between 45 and 75 keV, the life of the stage could be prolonged though the effect was about 50 percent less than with carbon ions.

Eighteenth Embodiment

Figure 27A:
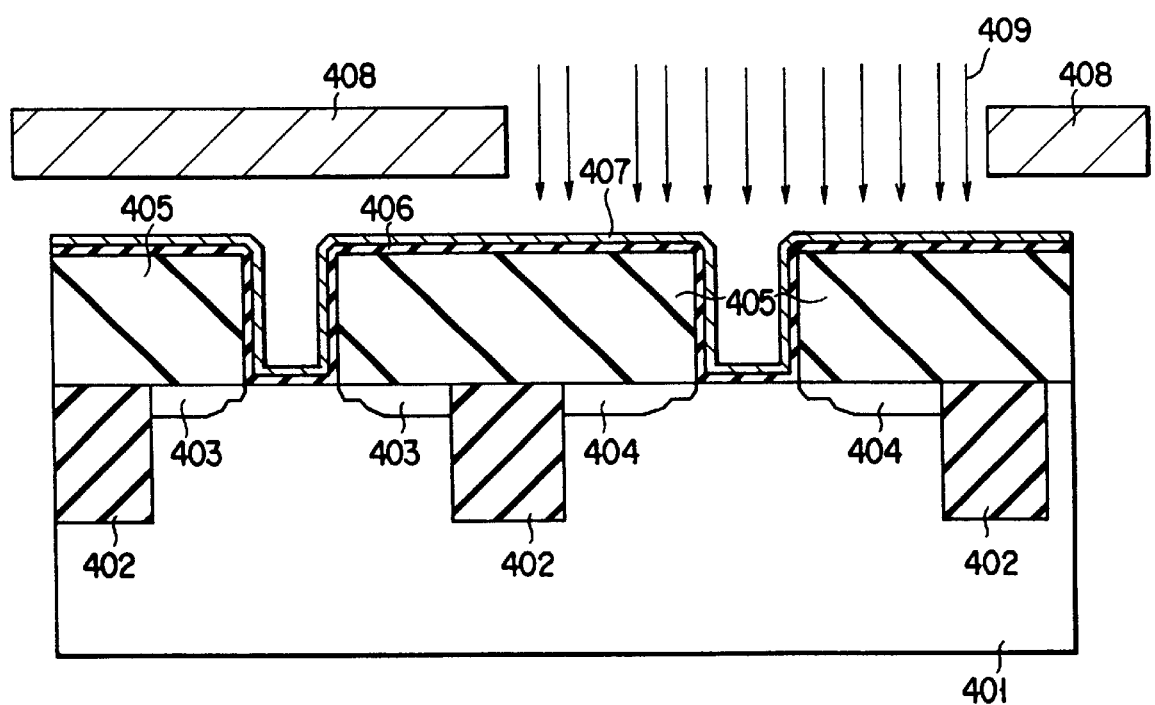
FIGS. 27A, 27B and 27C are schematic illustrations, in sectional view, of a CMOS transistor formation method according to an eighteenth embodiment of the present invention.
Figure 27B:
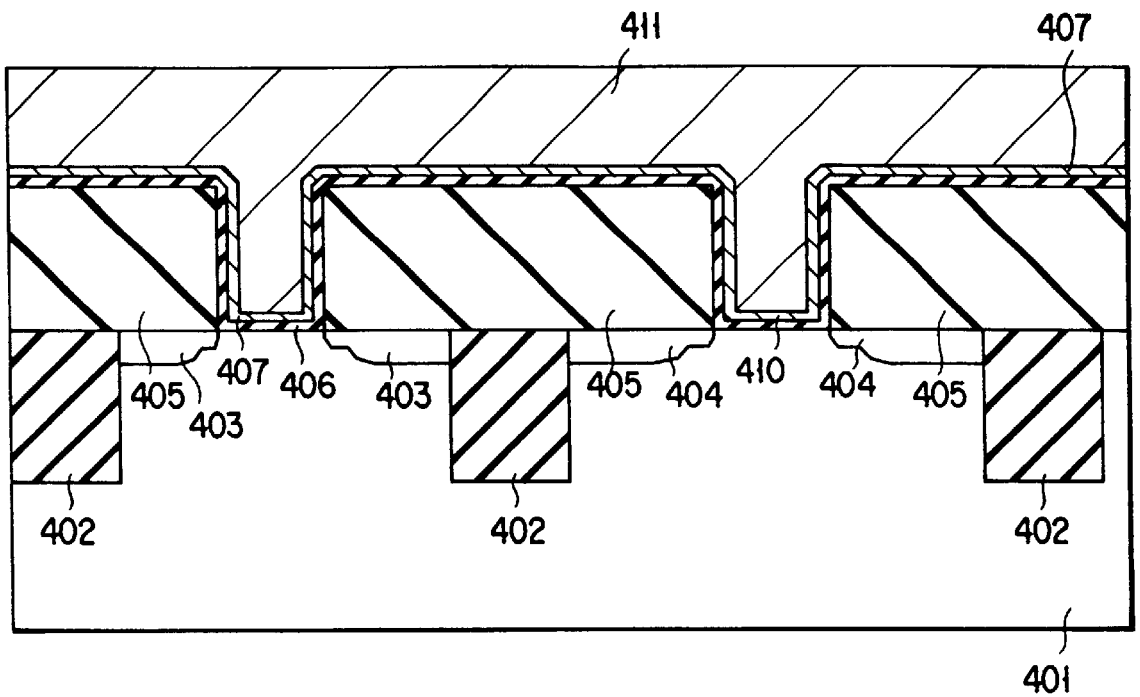
Figure 27C:
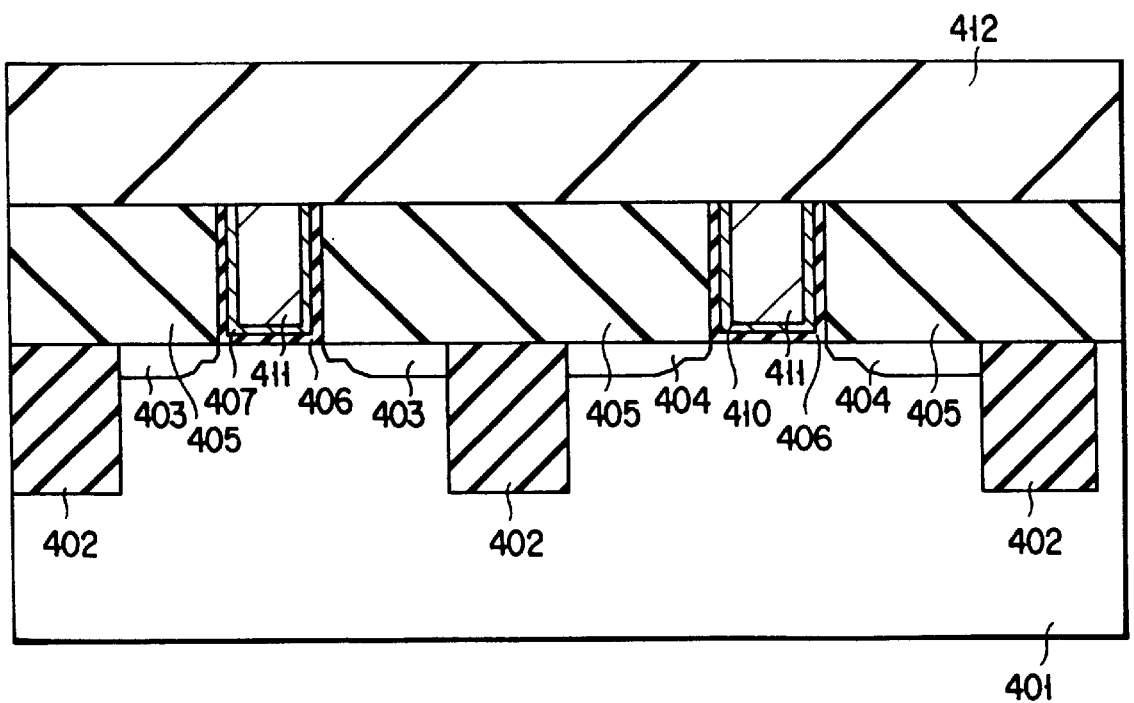

FIGS. 27A, 27B and 27C illustrate, in sectional view, a CMOS transistor manufacturing method according to an eighteenth embodiment of the present invention in the order of steps of manufacture. An example of using a metal for gate electrodes is described herein.

First, as shown in FIG. 27A, shallow trenches formed in the surface of a silicon surface 401 are filled up with a device isolation insulating film 402, thereby effecting shallow trench isolation (STI).

Next, p-type diffused layers (source/drain regions) 403 doped with a group III element, such as Ga or In, and n-type diffused layers (source/drain regions) 404 doped with a group V element, such as P, As, or Sb, are formed.

The p-type diffused layers 403 and the n-type diffused layers 404 each have an LDD (lightly doped drain) structure. The p-type diffused layers 403 and the n-type diffused layers 404 each are formed by two-step ion implantation. The first ion implantation step is performed using a dummy gate consisting of a film of silicon not shown as a mask. The next ion implantation step is performed using a spacer consisting of a film of silicon nitride formed on the dummy gate and its sidewall as a mask. In the first ion implantation step, the implant dose is less than in the second ion implantation step. The annealing of the implanted dopants may be performed with each ion implantation step or at one time after the second ion implantation step.

Next, a silicon oxide film 405 is formed over the entire surface so as to cover the dummy gate. The surface of a silicon oxide film 206 is then polished by means of mechanical polishing (MP) or chemical/mechanical polishing (CMP) until the surface of the dummy gate not shown is exposed. After that, the dummy gate is selectively removed.

Next, to adjust threshold voltages, impurity ions are implanted into portions each serving as a channel. After that, the defects resulting from the ion implantation are recovered by thermal processing and the implanted ions are activated.

Next, a gate insulating film 406 consisting of a high-permittivity material, such as $Ta_2O_5$, $TiO_2$, or $ZrO_2$, is formed over the entire surface. After that, a first gate electrode 407 consisting of TiN or TaN is formed on the gate insulating film 406 to a thickness of 10 nm or less.

In order to set the interface state density to $10^{11}$ cm$^{-2}$ or less, it is desirable to interpose a silicon oxide film or silicon oxy-nitride film of 1 nm or less in thickness between the silicon substrate 401 and the gate insulating film 406.

Next, a conductive mask 408 consisting of Si or SiC and having a thickness of 3 to 10 μm is placed at a distance of 20 μm or less from the surface of the silicon substrate. After that, carbon ions 409 are selectively implanted into n-channel MOS transistor regions and then heat treatment is carried out.

Here, the acceleration energy is set to between 0.2 and 1 keV and the dose is set to between $10^{15}$ and $10^{16}$ cm$^{-2}$. The thermal processing time is set to between 10 and 60 min when the thermal processing temperature is 450° C. or below or to within one minute when the thermal processing temperature is between 500 and 600° C. Such thermal processing allows the work function of TiN to decrease from 4.6 to 4.2 eV and the work function of TaN from 4.5 to 4.1 eV.

In this manner, the first gate electrode (TiN thin film or TaN thin film) 407 has its work function decreased in the n-channel MOS transistor regions and is kept unchanged in the p-channel MOS transistor regions. That is, the work function of the first gate electrode 407 can be set to an appropriate value for each MOS transistor.

Next, as shown in FIG. 27B, a metal film 411, consisting mainly of Al or Cu and serving as a second gate electrode, is deposited over the entire surface.

Next, as shown in FIG. 27C, the metal film 411 is polished by means of MP or CMP until the surface of the silicon oxide film 405 is exposed, thereby forming second gate electrodes 411. After that, an interlayer insulating film 412 is deposited over the entire surface, which consists of silicon oxide, SiCxOy, or CxFy.

After that, in accordance with well-known methods, contact holes are made and gate lead interconnects, source lead interconnects and drain lead interconnects are formed, thereby completing CMOS transistors.

As described above, the present invention allows metal gate electrodes (the first and second gate electrodes 407 and 411) having two work functions to be implemented with ease through ion implantation using the conductive mask 409.

When the work function of the gate electrode of the p-channel MOS transistor is required to be about 5 eV as opposed to 4.5 to 4.6 eV, a film of W, WNx, WSixNy, or Co is used as the first gate electrode 407. And the work function of the gate electrode of the n-channel MOS transistor is decreased by implanting carbon ions or boron ions whose electronegativity is smaller than 3 in Pauling scale into that film in the n-channel MOS transistor regions.

When the work function of the gate electrode of the n-channel MOS transistor is required to be about 4 eV as opposed to 4.5 to 4.6 eV, a film of HfN or ZrN is used as the first gate electrode 407. And the work function of the gate electrode of the p-channel MOS transistor is increased by implanting oxygen ions or fluorine ions whose electronegativity is 3 or more in Pauling scale into that film in the p-channel MOS transistor regions. However, the ion concentration needs to be set to within a range for which specific resistivity is 1 mΩ·cm or less. This is because, when this specific resistivity is exceeded, the switching characteristics of transistors are degraded.

So far, description was given of ion implantation into a metal film as a gate electrode. The present invention can be applied to ion implantation into a semiconductive film.

An example is ion implantation into a polysilicon gate electrode in dual-gate MOS transistor processing.

With a dual-gate MOS transistor, it is required to implant selectively n-type dopant ions into the polysilicon gate electrode of an n-channel MOS transistor and p-type dopant ions into that of a p-channel MOS transistor.

Heretofore, a separate resist mask is used for each ion implantation, which, as in ion implantation into a semiconductor substrate, increases the number of steps and cost. The ion implantation of the present invention, however, allows ions to be implanted into a polysilicon gate electrode without using any resist masks, decreasing the number of steps and cost.

The present invention is not limited to the embodiments thus far described. For example, the embodiments have been described mainly in terms of ion implantation processing in which the conductivity type and the dose of ions to be implanted are changed. The present invention can also be applied to the case where the other ion implantation parameter, such as acceleration energy, is changed. In short, the present invention can be applied where at least one of ion species, acceleration energy, and implant dose is changed.

The above embodiments may be used in combination. An example of such a combination is ion implantation apparatus which implants into a substrate to be processed ions generated by ion generation apparatus such as of the type described as the tenth embodiment through a conductive mask such as of the type described as the first embodiment.

The present invention may be practiced or embodied in still other ways without departing from the scope and spirit thereof.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:
    arranging a conductive mask including openings above a substrate to be processed, and implanting ions into a surface of the substrate by use of the conductive mask;
    changing a relative position between the substrate and the conductive mask, and then implanting ions into the surface of the substrate by use of the mask; and
    performing heat treatment to recover defects in the substrate resulting from the ions implanting.

2. The method for manufacturing a semiconductor device according to claim 1, wherein the relative position between the substrate and the conductive mask is changed a number of times such that facing surfaces of the conductive mask and the substrate are shifted in one direction from one end of the substrate to another end, and ions are implanted into the surface of the substrate by use of the conductive mask each time the relative position is changed.

3. The method for manufacturing a semiconductor device according to claim 2, wherein, when the facing surfaces of the conductive mask and the substrate have reached the another end, the relative position is changed to shift the facing surfaces in a direction perpendicular to the one direction, then relative position between the substrate and the conductive mask is changed a number of times such that the facing surfaces of the conductive mask and the substrate are shifted from the another end to the one end, and ions are implanted into the surface of the substrate by use of the conductive mask.

4. The method for manufacturing a semiconductor device according to claim 1, wherein the openings of the conductive mask correspond to a plurality of chips.

5. The method for manufacturing a semiconductor device according to claim 2, wherein the openings of the conductive mask correspond to a plurality of chips.

6. The method for manufacturing a semiconductor device according to claim 3, wherein the openings of said conductive mask correspond to a plurality of chips.

7. The method for manufacturing a semiconductor device according to claim 1, wherein the openings of said conductive mask correspond to channel wells.

8. The method for manufacturing a semiconductor device according to claim 2, wherein the openings of said conductive mask correspond to channel wells.

9. The method for manufacturing a semiconductor device according to claim 3, wherein the openings of said conductive mask correspond to channel wells.

10. A method for manufacturing a semiconductor device comprising:
    arranging a conductive mask including openings above a substrate to be processed, and implanting ions into the semiconductor substrate by use of the conductive mask; and
    changing a relative position between the substrate and the conductive mask and then, after a photolithography process, implanting ions into the surface of the substrate by use of the mask.

11. The method for manufacturing a semiconductor device according to claim 10, wherein the relative position between the substrate and the conductive mask is changed a number of times such that facing surfaces of the conductive mask and the substrate are shifted in one direction from one end of the substrate to another end, and ions are implanted into the surface of the substrate by use of the conductive mask each time the relative position is changed.

12. The method for manufacturing a semiconductor device according to claim 11, wherein, when the facing surfaces of the conductive mask and the substrate have reached the another end, the relative position is changed to shift the facing surfaces in a direction perpendicular to the one direction, then the relative position between the substrate and the conductive mask is changed a number of times such that the facing surfaces of the conductive mask and the substrate are shifted from the another end to the one end, and ions are implanted into the surface of the substrate by use of the conductive mask.

13. The method for manufacturing a semiconductor device according to claim 10, wherein, the openings of the conductive mask correspond to a plurality of chips.

14. The method for manufacturing a semiconductor device according to claim 11, wherein, the openings of the conductive mask correspond to a plurality of chips.

15. The method for manufacturing a semiconductor device according to claim 12, wherein, the openings of the conductive mask correspond to a plurality of chips.

16. The method for manufacturing a semiconductor device according to claim 10, wherein, the openings of the conductive mask correspond to channel wells.

17. The method for manufacturing a semiconductor device according to claim 11, wherein, the openings of the conductive mask correspond to channel wells.

18. The method for manufacturing a semiconductor device according to claim 12, wherein, the openings of the conductive mask correspond to channel wells.

19. A method for manufacturing a semiconductor device comprising:
    arranging a conductive mask including openings above a substrate to be processed, and implanting ions into a surface of the substrate by use of the conductive mask; and
    changing a relative position between the substrate and the conductive mask, and then implanting one of ions selected from a group consisting of B ions, Ga ions, In ions, P ions, As ions, and Sb ions into the surface of the substrate by use of the mask.

20. The method for manufacturing a semiconductor device according to claim 19, wherein the relative position between the substrate and the conductive mask is changed a number of times such that facing surfaces of the conductive mask and the substrate are shifted in one direction from one end of the substrate to another end, and ions are implanted into the surface of the substrate by use of the conductive mask each time the relative position is changed.

21. The method for manufacturing a semiconductor device according to claim 20, wherein, when the facing surfaces of the conductive mask and the substrate have reached the another end, the relative position is changed to shift the facing surfaces in a direction perpendicular to the one direction, then the relative position between the substrate and the conductive mask is changed a number of times such that the facing surfaces of the conductive mask and the substrate are shifted from the another end to the one end, and ions are implanted into the surface of the substrate by use of the conductive mask.

22. The method for manufacturing a semiconductor device according to claim 19, wherein, the openings of the conductive mask correspond to a plurality of chips.

23. The method for manufacturing a semiconductor device according to claim 20, wherein, the openings of the conductive mask correspond to a plurality of chips.

24. The method for manufacturing a semiconductor device according to claim 21, wherein, the openings of the conductive mask correspond to a plurality of chips.

25. The method for manufacturing a semiconductor device according to claim 19, wherein, the openings of the conductive mask correspond to channel wells.

26. The method for manufacturing a semiconductor device according to claim 20, wherein, the openings of the conductive mask correspond to channel wells.

27. The method for manufacturing a semiconductor device according to claim 21, wherein, the openings of the conductive mask correspond to channel wells.

28. A method for manufacturing a semiconductor device comprising:

arranging a conductive mask including openings above a substrate to be processed, and implanting ions into the semiconductor substrate by use of the conductive mask; and changing a relative position between the substrate and the conductive mask and then implanting ions into the surface of the substrate by use of the mask.

* * * * *

UNITED STATES PATENT AND TRADEMARK OFFICE
CERTIFICATE OF CORRECTION

PATENT NO. : 6,614,033 B2
DATED : September 2, 2003
INVENTOR(S) : Suguro et al.

It is certified that error appears in the above-identified patent and that said Letters Patent is hereby corrected as shown below:

Column 23,
Lines 63-64, change "said conductive mask" to -- the conductive mask --.

Signed and Sealed this

Twenty-fifth Day of May, 2004

JON W. DUDAS
*Acting Director of the United States Patent and Trademark Office*